(12) United States Patent
Kim et al.

(10) Patent No.: US 8,407,395 B2
(45) Date of Patent: Mar. 26, 2013

(54) SCALABLE MEMORY SYSTEM

(75) Inventors: Jin-Ki Kim, Ottawa (CA); HakJune Oh, Kanata (CA); Hong Beom Pyeon, Kanata (CA); Steven Przybylski, Ann Arbor, MI (US)

(73) Assignee: Mosaid Technologies Incorporated, Ottawa (CA)

( * ) Notice: Subject to any disclaimer, the term of this patent is extended or adjusted under 35 U.S.C. 154(b) by 725 days.

(21) Appl. No.: 11/843,440

(22) Filed: Aug. 22, 2007

(65) Prior Publication Data
US 2008/0049505 A1 Feb. 28, 2008

Related U.S. Application Data

(60) Provisional application No. 60/892,705, filed on Mar. 2, 2007, provisional application No. 60/902,003, filed on Feb. 16, 2007, provisional application No. 60/868,773, filed on Dec. 6, 2006, provisional application No. 60/839,329, filed on Aug. 22, 2006.

(51) Int. Cl.
*G06F 12/00* (2006.01)

(52) U.S. Cl. ............. 711/100; 711/5; 711/103; 711/154

(58) Field of Classification Search .................. 711/103, 711/154, 5, 100
See application file for complete search history.

(56) References Cited

U.S. PATENT DOCUMENTS

| | | |
|---|---|---|
| 4,617,566 A | 10/1986 | Diamond |
| 4,796,231 A | 1/1989 | Pinkham |
| 5,132,635 A | 7/1992 | Kennedy |
| 5,204,669 A | 4/1993 | Dorfe et al. |
| 5,243,703 A | 9/1993 | Farmwald et al. |
| 5,319,598 A | 6/1994 | Aralis et al. |
| 5,404,460 A | 4/1995 | Thompsen et al. |
| 5,430,859 A | 7/1995 | Norman et al. |
| 5,437,018 A | 7/1995 | Kobayashi et al. |
| 5,473,563 A | 12/1995 | Suh et al. |
| 5,473,566 A | 12/1995 | Rao |
| 5,473,577 A | 12/1995 | Miyake et al. |
| 5,475,854 A | 12/1995 | Thompsen et al. |
| 5,535,357 A | 7/1996 | Moran et al. |
| 5,636,342 A | 6/1997 | Jeffries |
| 5,721,840 A | 2/1998 | Soga |

(Continued)

FOREIGN PATENT DOCUMENTS

| | | |
|---|---|---|
| JP | 07-327179 | 12/1995 |
| JP | 2000-315185 | 11/2000 |

(Continued)

OTHER PUBLICATIONS

Takahiko Hara et al., "A 146mm2 8Gb NAND Flash Memory with 70nm CMOS Technology", 2005 IEEE International Solid-State Circuits Conference, 2005, Session 2, pp. 44-45&584.

(Continued)

*Primary Examiner* — Yong Choe
(74) *Attorney, Agent, or Firm* — Dennis R. Haszko

(57) ABSTRACT

A memory system architecture has serially connected memory devices. The memory system is scalable to include any number of memory devices without any performance degradation or complex redesign. Each memory device has a serial input/output interface for communicating between other memory devices and a memory controller. The memory controller issues commands in at least one bitstream, where the bitstream follows a modular command protocol. The command includes an operation code with optional address information and a device address, so that only the addressed memory device acts upon the command. Separate data output strobe and command input strobe signals are provided in parallel with each output data stream and input command data stream, respectively, for identifying the type of data and the length of the data. The modular command protocol is used for executing concurrent operations in each memory device to further improve performance.

40 Claims, 23 Drawing Sheets

U.S. PATENT DOCUMENTS

| | | | |
|---|---|---|---|
| 5,729,683 | A | 3/1998 | Le et al. |
| 5,740,379 | A | 4/1998 | Hartwig |
| 5,802,399 | A | 9/1998 | Yumoto et al. |
| 5,806,070 | A | 9/1998 | Norman et al. |
| 5,828,899 | A | 10/1998 | Richard et al. |
| 5,859,809 | A | 1/1999 | Kim |
| 5,959,930 | A | 9/1999 | Sakurai |
| 6,002,638 | A | 12/1999 | John |
| 6,091,660 | A | 7/2000 | Sasaki et al. |
| 6,144,576 | A | 11/2000 | Leddige et al. |
| 6,148,363 | A | 11/2000 | Lofgren et al. |
| 6,208,556 | B1 | 3/2001 | Akaogi et al. |
| 6,230,233 | B1 | 5/2001 | Lofgren et al. |
| 6,295,618 | B1 | 9/2001 | Keeth |
| 6,304,921 | B1 | 10/2001 | Rooke |
| 6,317,350 | B1 | 11/2001 | Pereira et al. |
| 6,317,352 | B1 | 11/2001 | Halbert et al. |
| 6,317,812 | B1 | 11/2001 | Lofgren et al. |
| 6,438,064 | B2 | 8/2002 | Ooishi |
| 6,442,098 | B1 | 8/2002 | Kengeri |
| 6,449,308 | B1 | 9/2002 | Knight, Jr. et al. |
| 6,456,528 | B1 | 9/2002 | Chen |
| 6,594,183 | B1 | 7/2003 | Lofgren et al. |
| 6,601,199 | B1 | 7/2003 | Fukuda et al. |
| 6,658,509 | B1 | 12/2003 | Bonella et al. |
| 6,680,904 | B1 | 1/2004 | Kaplan et al. |
| 6,715,044 | B2 | 3/2004 | Lofgren et al. |
| 6,717,847 | B2 | 4/2004 | Chen |
| 6,754,807 | B1 | 6/2004 | Parthasarathy et al. |
| 6,763,426 | B1 | 7/2004 | James et al. |
| 6,807,106 | B2 | 10/2004 | Gonzalez et al. |
| 6,816,933 | B1 | 11/2004 | Andreas |
| 6,850,443 | B2 | 2/2005 | Lofgren et al. |
| 6,853,557 | B1 | 2/2005 | Haba et al. |
| 6,853,573 | B2 | 2/2005 | Kim et al. |
| 6,928,501 | B2 | 8/2005 | Andreas et al. |
| 6,944,697 | B2 | 9/2005 | Andreas |
| 6,950,325 | B1 | 9/2005 | Chen |
| 6,978,402 | B2 | 12/2005 | Hirabayashi |
| 6,996,644 | B2 | 2/2006 | Schoch et al. |
| 7,031,221 | B2 | 4/2006 | Mooney et al. |
| 7,032,039 | B2 | 4/2006 | DeCaro |
| 7,308,524 | B2 * | 12/2007 | Grundy et al. .......... 711/103 |
| 7,356,639 | B2 | 4/2008 | Perego et al. |
| 2003/0137860 | A1 * | 7/2003 | Khatri et al. .......... 365/63 |
| 2006/0031593 | A1 | 2/2006 | Sinclair |
| 2007/0076479 | A1 | 4/2007 | Kim et al. |
| 2007/0109833 | A1 | 5/2007 | Pyeon et al. |
| 2008/0052449 | A1 | 2/2008 | Kim et al. |

FOREIGN PATENT DOCUMENTS

| | | |
|---|---|---|
| JP | 2004-070954 | 3/2004 |
| JP | 2004-110849 | 4/2004 |
| WO | 2005/069150 | 7/2005 |

OTHER PUBLICATIONS

Dae-Seok Byeon et al., "A 8Gb Multi-Level NAND Flash Memory with 63nm STI CMOS Process Technology", 2005 IEEE International Solid-State Circuits Conference, 2005, Session 2, pp. 46-47.

Toru Tanzawa et al., "Circuit Techniques for a 1.8-V-Only NAND Flash Memory", IEEE Journal of Solid-State Circuits, Jan. 2002, vol. 37 No. 1, pp. 84-89.

Shinji Saito et al., "THPM 13.8: A Programmable 80ns 1Mb CMOS EPROM", 1985 IEEE International Solid State Circuits Conference, Feb. 14, 1985, Session XIII, pp. 176-177&340.

Masaki Momodomi et al., "A 4-Mb NAND EEPROM with Tight Programmed Vt Distribution", IEEE Journal of Solid-State Circuits, Apr. 1991, vol. 26 No. 4, pp. 492-496.

Nobuaki Ohtsuka et al., "A 4-Mbit CMOS EPROM, IEEE Journal of Solid-State Circuits", Oct. 1987, vol. sc-22 No. 5, pp. 669-675.

Jin-Ki Kim et al., "A 120-mm2 64-Mb NAND Flash Memory Achieving 180 ns/Byte Effective Program Speed", IEEE Journal of Solid-State Circuits, May 1997, vol. 32 No. 5, pp. 670-680.

Kang-Deog Suh et al., "A 3.3 V 32 Mb NAND Flash Memory with Incremental Step Pulse Programming Scheme", IEEE Journal of Solid-State Circuits, Nov. 1995, vol. 30 No. 11, pp. 1149-1156.

Ken Takeuchi et al., "A Multipage Cell Architecture for High-Speed Programming Multilevel NAND Flash Memories", IEEE Journal of Solid-State Circuits, Aug. 1998, vol. 33 No. 8, pp. 1228-1238.

Toru Tanzawa et al., "A Dynamic Analysis of the Dickson Charge Pump Circuit", IEEE Journal of Solid-State Circuits, Aug. 1997, vol. 32 No. 8, pp. 1231-1240.

Tomoharu Tanaka et al., "A Quick Intelligent Page-Programming Architecture and a Shielded Bitline Sensing Method for 3 V-Only NAND Flash Memory", IEEE Journal of Solid-State Circuits, Nov. 1994, vol. 29 No. 11, pp. 1366-1373.

Kenichi Imamiya et al., "A 125-mm2 1-Gb NAND Flash Memory With 10-MByte/s Program Speed", IEEE Journal of Solid-State Circuits, Nov. 2002, vol. 37 No. 11, pp. 1493-1501.

June Lee et al., "High-Performance 1-Gb NAND Flash Memory With 0.12-um Technology", IEEE Journal of Solid-State Circuits, Nov. 2002, vol. 37 No. 11, pp. 1502-1509.

Tae-Sung Jung et al., "A 117-mm2 3.3-V Only 128-Mb Multilevel NAND Flash Memory for Mass Storage Applications", IEEE Journal of Solid-State Circuits, Nov. 1996, vol. 31 No. 11, pp. 1575-1583.

Naoto Tomita et al., "A 62-ns 16-Mb CMOS EPROM with Voltage Stress Relaxation Technique", IEEE Journal of Solid-State Circuits, Nov. 1991, vol. 26 No. 11, pp. 1593-1599.

Taehee Cho et al., "A Dual-Mode NAND Flash Memory: 1-Gb Multilevel and High-Performance 512-Mb Single-Level Modes", IEEE Journal of Solid-State Circuits, Nov. 2001, vol. 36 No. 11, pp. 1700-1706.

R. Kirisawa et al., "A NAND Structured Cell With a New Programming Technology for Highly Reliable 5V-Only Flash EEPROM", 1990 Symposium on VLSI Technology, 1990, pp. 129-130.

S. Aritome et al., "A Reliable Bi-Polarity Write/Erase Technology in Flash EEPROMs", IEDM, 1990, pp. 111-114.

R. Shirota et al., "A 2.3um2 Memory Cell Structure for 16Mb NAND EEPROMs", IEDM, 1990, pp. 103-106.

Takahiko Hara et al., "A 146-mm2 8-Gb Multi-Level NAND Flash Memory With 70-nm CMOS Technology", IEEE Journal of Solid-State Circuits, Jan. 2006, Vol. 41 No. 1, pp. 161-169.

Seungjae Lee et al., A 3.3V 4Gb Four-Level NAND Flash Memory with 90nm CMOS Technology, 2004 IEEE International Solid-State Circuits Conference, Feb. 16, 2004, Session 2—Non-Volatile Memory 2.7.

Ken Takeuchi et al., "A 56nm CMOS 99mm2 8Gb Multi-level NAND Flash Memory with 10MB/s Program Throughput", 2006 IEEE International Solid-State Circuits Conference, Feb. 6, 2006, Session 7—Non-Volatile Memory 7.7, pp. 144-145 & 645.

"256M×8 Bit / 128M×16 Bit / 512M×8 Bit NAND Flash Memory", K9K4G08U1M, K9F2G08U0M, K9F2G16U0M, Rev. 0.4, Samsung Electronics Co., Ltd., Apr. 9, 2003, pp. 1-41.

"1G×8 Bit/ 2G×8 Bit NAND Flash Memory", K9KAG08U1M, K9F8G08U0M, K9F8G08B0M, Rev. 1.0, Samsung Electronics Co., Ltd., Mar. 31, 2007, pp. 1-54.

"512M×8 Bit / 1G×8 Bit NAND Flash Memory", K9K8G08U1A, K9F4G08U0A, Rev. 1.0, Samsung Electronics Co., Ltd., Mar. 7, 2006, pp. 1-43.

"1G×8 Bit / 2G×8 Bit / 4G×8 Bit NAND Flash Memory", K9WAG08U1A, K9K8G08U0A, K9NBG08U5A, Rev. 1.1, Samsung Electronics Co., LTD, Jul. 18, 2006, pp. 1-50.

Young Choi, "16-Gbit MLC NAND flash weighs in", EETimes Online, http://www.eetimes.com/showArticle.jhtml?articleID=201200825&printable=true, Jul. 30, 2007.

Eran Gal et al., "Algorithms and Data Structures for Flash Memories", ACM Computing Surveys, Jun. 2005, vol. 37, No. 2, pp. 138-163.

June Lee at al., A 90-nm CMOS 1.8-V 2-Gb NAND Flash Memory for Mass Storage Applications, IEEE Journal of Solid-State Circuits, Nov. 2003, vol. 38 No. 11, pp. 1934-1942.

"2G×8 Bit NAND Flash Memory", K9GAG08U0M, Rev. 0.1, Samsung Electronics Co., LTD., Sep. 21, 2006, pp. 1-48.

"16 GBIT (2G×8 BIT) CMOS NAND E2PROM (Mulit-Level-Cell)", TC58NVG4D1DTG00, Toshiba Corporation, Nov. 9, 2006, pp. 1-64.

"2GBIT (256M×8BITS) CMOS NAND E2PROM", TH58NVG1S3AFT05, Toshiba Corporation, May 19, 2003, pp. 1-32.

IEEE Standard for High-Bandwidth Memory Interface Based on Scalable Coherent Interface (SCI) Signaling Technology (RamLink), IEEE Std 1596.4-1996, Mar. 19, 1996, Institute of Electrical and Electronic Engineers, Inc., New York, USA, pp. i-vii & 1-91.

King et al., "Communicating with Daisy Chained MCP42XXX Digital Potentiometers", 2001 Microtechnology Inc.

Microchip Product Description 24AA1025/24LC1025/24FC1025, 2006 Michropchip Technology Inc.

Intel, "Intel StrataFlash Wireless Memory (L18)", Order No. 251902, Revision 010, Aug. 2005.

Intel ,"How to Use OTP Registers for Security Applications", Application Note 717, Oct. 1999, Order No. 292265-001.

Samsung Electronics Product Description "K9XXG08Uxm".

Atmel Product Description "8-megabit 2.5-volt Only or 2.7-volt Only DataFlash", AT45DB081B.

The I 2C-Bus Specification, Version 2.1, Jan. 2000.

Spansion Data Sheet, S70GL01GN00 MirrorBit Flash 1024 Megabit, 3.0 Volt-only Page Mode Flash Memory Featuring 110 mm MirrorBit Process Technology, Jun. 1, 2005.

Silicon Storage Technology, Inc. Specification, "16 Mbit SPI Serial Flash".

ST Product Description, "2 Mbit, Low Voltage, Serial Flash Memory With 40MHz SPI Bus Interface", Aug. 2005.

HyperTransport Technology Consortium, HyperTransport I/O Link Specification, Revision 3.00, Apr. 21, 2006.

Samsung, "DDR2 Fully Buffered DIMM: 240pin FBDIMMs based on 512Mb C-die".

Kennedy et al., "A 2Gb/s Point-to-Point Heterogeneous Voltage Capable DRAM for Capacity-Scalable Memory Subsystems", IEEE International Solid-State Circuits Conference, 2004.

Kim et al., A 3.6Gb/s/pin Simultaneous Bidirectional (SBD) I/O Interface for High-Speed DRAM, IEEE International Solid-State Circuits Conference, 2004.

EP 07800496.7-1233 Extended European Search Report, 7 pages, Dec. 4, 2009.

Atmel Corp., "High Speed Small Sectored SPI Flash Memory", pp. 1-23, 2006.

Spansion, 64 Megabit CMOS 3.0 Volt Flash Memory with 50 MHz SPI, Spansion, pp. 1-22 (2006).

Intel Corporation, "Intel® Advanced+Boot Block Flash Memory (C3)", May 2005, pp. 1-72.

M-Systems Flash Disk Pioneers Ltd., "DiskOnChip H1 4Gb (512MByte) and 8 Gb (1 GByte) High Capacity Flash Disk with NAND and x2 Technology", Data Sheet, Rev. 0.5 (Preliminary), pp. 1-66, 2005.

Tal, A., "Guidelines for Integrating DiskOnChip in a Host System", AP-DOC-1004, Rev. 1.0, M-Systems Flash Pioneers Ltd., pp. 1-15, 2004.

Samsung Electronics Co. Ltd. ONENAND4G(KFW4G16Q2M-DEB6), ONENAND2G(KFH2G16Q2M-DEB6), ONENAND1G(KFW1G16Q2M-DEB6) Flash Memory, ONENAND™ Specification Ver. 1.2. pp. 1-125, Dec. 23, 2005.

Oshima, et al., "High-Speed Memory Architectures for Multimedia Applications", Circuits & Devices, IEEE 8755-3996/97, pp. 8-13, Jan. 1997.

Diamond, S.L., "SyncLink: High: High-speed DRAM for the Future", Micro Standards, IEEE Micro, pp. 74-75, Dec. 1996.

Silicon Storage Technology, "16 Mbit SPI Serial Flash," Preliminary Specification, Silicon Storage Technology Inc., (2005), 28 pages.

STMicroelectronics, "2MBIT, Low Voltage, Serial Flash Memory With 40 MHZ SPI Bus Interface," Technical Specification, STMicroelectronics Group of Companies, August (2005), 40 pages.

"NAND Flash Applications Design Guide," Revision 1.0, Toshiba America Electronics Components, Inc., (Apr. 2003).

* cited by examiner

| Command Packet | 1st Byte | 2nd Byte | 3rd Byte | 4th Byte | 5th Byte | 6th Byte | 7th Byte | ... | 2115th Byte | 2116th Byte |
|---|---|---|---|---|---|---|---|---|---|---|
| Page Read | DA | 0Xh | RA | RA | RA | - | - | - | - | - |
| Page Read for Copy | DA | 1Xh | RA | RA | RA | - | - | - | - | - |
| Burst Data Read | DA | 2Xh | CA | CA | - | - | - | - | - | - |
| Burst Data Load Start | DA | 4Xh | CA | CA | DATA | DATA | DATA | ... | DATA | DATA |
| Burst Data Load | DA | 5Xh | CA | CA | DATA | DATA | DATA | ... | DATA | DATA |
| Page Program | DA | 6Xh | RA | RA | RA | - | - | - | - | - |
| Block Erase Address Input | DA | 8Xh | RA | RA | RA | - | - | - | - | - |
| Page-pair Erase Address Input | DA | 9Xh | RA | RA | RA | - | - | - | - | - |
| Erase | DA | AXh | - | - | - | - | - | - | - | - |
| Operation Abort | DA | CXh | - | - | - | - | - | - | - | - |
| Read Status Register | DA | F0h | - | - | - | - | - | - | - | - |
| Read Device Information Register | DA | F4h | - | - | - | - | - | - | - | - |
| Read Link Configuration Register | DA | F7h | - | - | - | - | - | - | - | - |
| Write Link Configuration Register | FFh | FFh | DATA | - | - | - | - | - | - | - |

Figure 9

SCALABLE MEMORY SYSTEM

CROSS REFERENCE TO RELATED APPLICATIONS

This application claims the benefit of priority of U.S. Provisional Patent Application No. 60/839,329 filed on Aug. 22, 2006; U.S. Provisional Patent Application No. 60/868,773 filed on Dec. 6, 2006; U.S. Provisional Patent Application No. 60/902,003 filed on Feb. 16, 2007; and U.S. Provisional Patent Application Ser. No. 60/892,705 filed on Mar. 2, 2007, the contents of which are incorporated herein by reference in their entirety.

FIELD OF THE INVENTION

The present invention relates generally to memory systems. More particularly, the present invention relates to a memory system of serially connected memory devices for mass storage applications.

BACKGROUND OF THE INVENTION

Flash memory is a commonly used type of non-volatile memory in widespread use as mass storage for consumer electronics, such as digital cameras and portable digital music players for example. The density of a presently available Flash memory chip can be up to 32 Gbits (4 GB), which is suitable for use in popular USB Flash drives since the size of one Flash chip is small.

FIG. 1 is a general block diagram of one bank of a known NAND flash memory. Those skilled in the art will understand that a flash memory device can have any number of banks. Bank 30 is organized into k+1 blocks. Each block consists of NAND memory cell strings, having up to i+1 flash memory cells serially connected to each other. Accordingly, wordlines WL0 to WLi are connected to the gates of each Flash memory cell in the memory cell string. A string select device connected to signal SSL (string select line) selectively connects the memory cell string to a bitline, while a ground select device connected to signal GSL (ground select line) selectively connects the memory cell string to a source line, such as VSS. The string select device and the ground select device are n-channel transistors. There are j+1 bitlines common to all blocks of bank 30, and each bitline is connected to one NAND memory cell string in each of blocks [0] to [k]. Each wordline (WL0 to WLi), SSL and GSL signal is connected to the same corresponding transistor device in each NAND memory cell string in the block. As those skilled in the art should be aware, data stored in the flash memory cells along one wordline is referred to as a page of data.

Connected to each bitline outside of the bank 30 is a data register 32 for storing one page of write data to be programmed into one page of flash memory cells, or read data accessed from the flash memory cells. Data register 32 also includes sense circuits for sensing data read from one page of flash memory cells. During programming operations, the data registers perform program verify operations to ensure that the data has been properly programmed into the flash memory cells connected to the selected wordline. Each memory cell of bank 30 can store a single bit of data or multiple bits of data. Some flash memory devices will have more than one set of data registers to increase throughput.

The advent of 8 mega pixel digital cameras and portable digital entertainment devices with music and video capabilities has spurred demand for ultra-high capacities to store the large amounts of data, which cannot be met by the single Flash memory device. Therefore, multiple Flash memory devices are combined together into a memory system to effectively increase the available storage capacity. For example, Flash storage densities of 20 GB may be required for such applications.

FIG. 2 is a block diagram of a prior art flash memory system 10 integrated with a host system 12. Flash memory system 10 includes a memory controller 14 in communication with host system 12, and multiple non-volatile memory devices 16. The host system will include a processing device such as a microcontroller, microprocessor, or a computer system. The Flash memory system 10 of FIG. 2 is configured to include one channel 18, where memory devices 16 are connected in parallel to channel 18. Those skilled in the art will understand that the memory system 10 can have more or less than four memory devices connected to it.

Channel 18 includes a set of common buses, which include data and control lines that are connected to all its corresponding memory devices. Each memory device is enabled/disabled with respective chip select signals CE#1, CE#2, CE#3 and CE#4, provided by memory controller 14. The "#" indicates that the signal is an active low logic level signal. The memory controller 14 is responsible for issuing commands and data, via the channel 18, to a selected memory device based on the operation of the host system 12. Data read from the memory devices is transferred via the channel 18 back to the memory controller 14 and host system 12. Operation of flash memory system 10 is synchronized to a clock CLK, which is provided in parallel to each memory device 16. Flash memory system 10 is generally referred to as a multi-drop configuration, in which the memory devices 16 are connected in parallel with respect to channel 18.

In Flash memory system 10, non-volatile memory devices 16 can be identical to each other, and are typically implemented as NAND flash memory devices. Those skilled in the art will understand that flash memory is organized into banks, and each bank is organized into blocks to facilitate block erasure. Most commercially available NAND flash memory devices are configured to have two banks of memory.

There are specific issues that will adversely impact performance of the system. The configuration of Flash memory system 10 imposes physical performance limitations. With the large number of parallel signals extending across the system, the signal integrity of the signals they carry will be degraded by crosstalk, signal skew, and simultaneous switching noise (SSN). Power consumption in such a configuration becomes an issue as each signal track between the flash controller and flash memory devices is frequently charged and discharged for signaling. With increasing system clock frequencies, the power consumption will increase.

There is also a practical limit to the number of memory devices which can be connected in parallel to the channel since the drive capability of a single memory device is small relative to the loading of the long signal tracks. Furthermore, as the number of memory devices increase, more chip enable signals (CE#) are required, and the clock signal CLK will need to be routed to the additional memory devices. Clock performance issues due to extensive clock distribution are well known in the art, which would need to be addressed. Therefore, in order to accommodate a memory system having a large number of memory devices, either a controller having more channels must be used, or and/or the system will need to be clocked at a lower frequency. A controller configured to have multiple channels and additional chip enable signals increases the cost of the memory system. Otherwise, the memory system is limited to a small number of memory devices.

It is, therefore, desirable to provide a memory system architecture capable of supporting any number of memory devices.

SUMMARY OF THE INVENTION

It is an aspect of the embodiments to obviate or mitigate at least one disadvantage of previous memory systems.

In a first aspect, there is provided a memory system having a controller and a memory device. The controller includes a serial channel output port for providing a serial bitstream command packet, and a serial channel input port for receiving a serial bitstream read data packet. The serial bitstream command packet includes an operational code and a device address. The memory device has an input port for receiving the serial bitstream command packet from the controller and for executing the operation code if the device address corresponds to the memory device. The memory device provides the serial bitstream command packet through an output port and subsequently provides the serial bitstream read data packet through the output port if the operation code corresponds to a read function.

According to an embodiment of the present aspect, there is at least one intervening memory device coupled in series between the memory device and the controller. The at least one intervening memory device having an input port for receiving and passing the serial bitstream command packet to the memory device, and subsequently providing the serial bitstream read data packet if the device address corresponds to the memory device and the operation code corresponds to a read function.

According to further embodiments, complementary clock signals are provided to the memory device and the at least one intervening memory device in parallel, or the complementary clock signals are provided to the at least one intervening memory device, and passed by the at least one intervening memory device to the memory device, and passed by the memory device to the controller.

In a further embodiment of the present aspect, the memory system includes an expansion link between the controller and the memory device for receiving one of an expansion module and a jumper. The at least one intervening memory device is part of an expansion module having coupling means configured for electrical coupling with the expansion link.

According to further embodiments, the memory device and the at least one intervening memory device each include a native memory core and a serial interface and control logic block for controlling the native memory core in response to the serial bitstream command packet. The memory device native memory core and the at least one intervening memory device native memory core can be NAND flash based, or can be DRAM, SRAM, NAND flash and NOR flash memory cores.

In yet another embodiment of the present aspect, the serial bitstream command packet has a modular structure where the size of the serial bitstream command packet is variable. The serial bitstream command packet can include a command field for providing the operation code and the device address, where the command field includes a first sub-field for providing the operation code, and a second sub-field for providing the device address. The serial bitstream command packet can include a command field for providing the operation code and the device address, and an address field for providing one of a row address and a column address. The serial bitstream command packet can include a command field for providing the operation code and the device address, an address field for providing one of a row address and a column address, and a data field for providing write data.

According to an aspect of the previous embodiment, the controller provides a command strobe in parallel with the serial bitstream command packet, the command strobe having an active level matching the length of the serial bitstream command packet. Furthermore, the controller provides a data input strobe in parallel with the serial bitstream read data packet, the data input strobe having an active level matching the length of the serial bitstream read data packet. The memory device latches the serial bitstream command packet in response to the active level of the command strobe when the device address corresponds to the memory device, and the memory device output port is enabled in response to the active level of the data input strobe. The command strobe and the data input strobe are non-overlapping signals, and are separated by at least one data latching clock edge. Additionally, the command strobe is separated from an adjacent command strobe by at least one data latching clock edge, and the data input strobe is separated from an adjacent data input strobe by at least one data latching clock edge.

In a second aspect, there is provided a command packet having a series of bits for a memory system having serially connected memory devices. The command packet includes a command field for selecting a memory device of the serially connected memory devices to execute a specific memory operation.

In an embodiment of the second aspect, the command field includes a first sub-field for providing a device address for selecting the memory device, and a second sub-field for providing an operation code corresponding to the specific memory operation. The command packet further includes an address field following the command field for providing one of a row address and a column address when the operation code corresponds to a read or write operation, the address field having a bit length corresponding to the row address or the column address. A data field follows the address field for providing write data for storage in the memory device when the operation code corresponds to the write operation, the data field having a bit length corresponding to the write data.

In a third aspect, there is provided a method for executing concurrent operations in a selected memory device of a memory system having serially connected memory devices. The method includes receiving a first command; executing core operations in a first memory bank of the selected memory device in response to the first command; receiving a second command during execution of core operations in the first memory bank; and, executing core operations in a second memory bank of the selected memory device in response to the second command.

According to an embodiment of the present aspect, the method further includes receiving a third command for requesting result information from one of the first memory bank and the second memory bank, and outputting a read data packet containing the result information in response to the third command. The result information includes one of status register data and read data.

In yet another embodiment of the present aspect, the first command, the second command and the third command are command packets including a series of bits logically configured to include a mandatory command field for providing an operation code and a device address, an optional address field following the command field for providing one of a row and column address when the operation code corresponds to a read or write operation, and an optional data field following the address field for providing write data when the operation code corresponds to the write operation.

In an aspect of the present embodiment, a first command strobe is received in parallel with the first command, the first command strobe having an active duration corresponding to the length of the first command, and a second command strobe is received in parallel with the second command, the second command strobe having an active duration corresponding to the length of the second command. The first command strobe and the second command strobe are separated by at least one data latching clock edge. Furthermore, a data input strobe is received for enabling outputting of the read data packet while the data input strobe is at the active level, such that the second command strobe and data input strobe are separated by at least one data latching clock edge.

In another embodiment, the method further includes powering up the selected memory device before receiving the first command. The step of powering up includes asserting a control signal to maintain the selected memory device in a default state prior to a power transition; transitioning a power level of the selected memory device from a first voltage level to a second voltage level while the control signal is asserted; waiting for a predetermined duration of time to allow the power level to stabilize; and de-asserting the control signal to release the selected memory device from the default state thereby preventing accidental program or erase operation in the selected memory device. The second voltage level can be a minimum voltage level for stable circuit operation or a maximum operating voltage level of a power supply. The first voltage level can correspond to a low power mode operating voltage level of a power supply or the absence of a power supply.

In a further embodiment, maintaining the memory device in the default state includes setting device registers in the memory device to a default value, where the device registers include command registers. A further step of the method can include performing device initialization upon release of the memory device from the default state. The step of performing device initialization can include generating device address and device identifier information for the memory device.

In yet another embodiment, the step of powering up includes asserting a control signal at a first time to maintain the memory device in a default state prior to a power transition; transistioning a power level of the memory device from a first level to a second level at a second subsequent time while the control signal is asserted; waiting for a predetermined duration of time to allow the power level to stabilize; and de-asserting the control signal at a third subsequent time for releasing the memory device from the default state thereby preventing accidental program or erase operation in the memory device.

In a fourth aspect, there is provided a memory system comprising a plurality of memory devices and a controller for controlling the devices. The controller has an output port for providing a bitstream command packet to a first device of the plurality of memory devices, the bitstream command packet including an operational code and a device address. Each of the plurality of memory devices receive the bitstream command packet from one of the controller and a prior memory device, and executes the operation code if the device address corresponds thereto, each of the plurality of memory devices providing the bitstream command packet to one of a next memory device and the controller, a bitstream read data packet being provided from a last memory device of the plurality of memory devices to the controller if the operation code corresponds to a read function.

According to an embodiment of the present aspect, the plurality of memory devices are connected in series, the first and last memory devices being connected to the controller, and the controller sends a bitstream data packet to the first device of the plurality of memory devices. The bitstream data packet from the controller and the bitstream read data packet comprises a serial bitstream or comprises parallel bitstreams. The plurality of memory devices are either of the same type or a mix of different types of memory devices.

According to another aspect, there is provided a memory system comprising a plurality of memory devices and a controller for controlling the devices, the memory system being capable of performing the function of powering up a selected memory device before receiving a first command.

For example, the function of powering up includes: asserting a control signal to maintain the selected memory device in a default state prior to a power transition; transitioning a power level of the selected memory device from a first voltage level to a second voltage level while the control signal is asserted; waiting for a predetermined duration of time to allow the power level to stabilize; and de-asserting the control signal to release the selected memory device from the default state thereby preventing accidental program or erase operation in the selected memory device. Also, the function of powering up may include: asserting a control signal at a first time, to maintain the memory device in a default state prior to a power transition; transistioning a power level of the memory device from a first level to a second level at a second subsequent time while the control signal is asserted; waiting for a predetermined duration of time to allow the power level to stabilize; and de-asserting the control signal at a third subsequent time for releasing the memory device from the default state thereby preventing accidental program or erase operation in the memory device.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 9 shows a table listing example modular command packets for operating a flash memory device of FIG. 7;

DETAILED DESCRIPTION

In the following detailed description of embodiments of the present invention, reference is made to the accompanying drawings which form a part hereof, and in which is shown by way of illustration of specific embodiments in which the present invention may be practiced. These embodiments are described in sufficient detail to enable those of ordinary skill in the art to practice the present invention, and it is to be understood that other embodiments may be utilized and that logical, electrical, and other changes may be made without departing from the scope of the present invention. The following detailed description is, therefore, not to be taken in a limiting sense, and the scope of the present invention is defined by the appended claims.

A memory system architecture having serially connected memory devices is described. The memory system is scalable to include any number of memory devices without any performance degradation or complex redesign. Each memory device has a serial input/output interface for communicating between other memory devices and a memory controller. The memory controller issues commands in at least one bitstream, where the bitstream follows a modular command protocol. The command includes an operation code with optional address information and a device address, so that only the addressed memory device acts upon the command. Separate data output strobe and command input strobe signals are provided in parallel with each output data stream and input command data stream, respectively, for identifying the type of data and the length of the data. The modular command protocol is used for executing concurrent operations in each memory device to further improve performance.

Figure 3A:
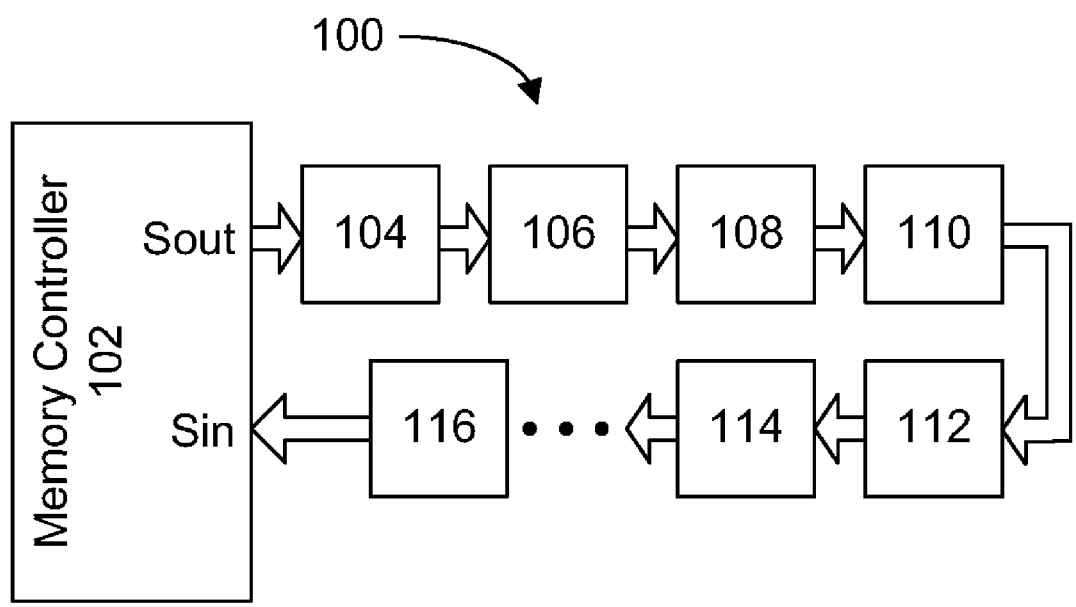
FIG. 3A is a general block diagram of a serial memory system.

FIG. 3A is a block diagram illustrating the conceptual nature of a serial memory system architecture, according to one embodiment. In FIG. 3A, the serial memory system 100 includes a memory controller 102 having at least one serial channel output port Sout and a serial channel input port Sin, and memory devices 104, 106, 108, 110, 112, 114 and 116 that are connected in series. In one embodiment, the memory devices can be flash memory devices. Alternately, the memory devices can be DRAM, SRAM or any other type of memory device provided it has a serial input/output interface compatible with a specific command structure, for executing commands or passing through commands and data to the next memory device. Further details of such memory device configuration and a specific command structure will be described later.

The current embodiment includes seven memory devices, but alternate embodiments can include as few as one memory device, and up to any number of memory devices. Accordingly, if memory device 104 is the first device of serial memory system 100 as it is connected to Sout, then memory device 116 is the Nth or last device as it is connected to Sin, where N is an integer number greater than zero. Memory devices 106 to 114 are then intervening serially connected memory devices between the first and last memory devices. Each memory device can assume a distinct identification number, or device address (DA) upon power up initialization of the system, so that they are individually addressable. Commonly owned U.S. patent application Ser. Nos. 11/622,828, 11/750,649, 11/692,452, 11/692,446, 11/692,326 and 11/771,023 describe methods for generating device addresses for serially connected memory devices of a memory system, the contents of which is incorporated by reference in its entirety.

Memory devices 104 to 116 are considered serially connected because the data input of one memory device is connected to the data output of a previous memory device, thereby forming a series-connection configuration, with the exception of the first and last memory devices in the chain.

The channel of memory controller 102 includes a data channel of any data width to carry command, data and address information, and a control channel to carry control signal data. Further details of the channel configuration will be shown later. The embodiment of FIG. 3A includes one channel, where one channel includes Sout and corresponding Sin ports. However, memory controller 102 can include any number of channels for accommodating separate memory device chains.

In general operation, the memory controller 102 issues a command through its Sout port, which includes an operational code (op code), a device address, address information for reading or programming, and data for programming. The command is issued as a serial bitstream packet, where the packet can be logically subdivided into predetermined size segments, such as a byte for example. A bitstream is a sequence or series of bits provided over time. The command is received by the first memory device 104, which compares the device address to its assigned address. If the addresses match, then memory device 104 executes the command. Otherwise, the command is passed through its own output port to the next memory device 106, where the same procedure is repeated. Eventually, the memory device having the matching device address, referred to as a selected memory device, will execute the operation dictated by the command. If the command is to read data, the selected memory device will output the read data through its output port, which is serially passed through intervening memory devices until it reaches the Sin port of the memory controller 102.

Since the commands and data are provided in a serial bitstream, a clock is used by each memory device for clocking in/out the serial bits and for synchronizing internal memory device operations. This clock is used by the memory controller and all the memory devices in the serial memory system 100. There are two possible clock configurations for serial memory system 100, as will be illustrated in the embodiments of FIG. 4 and FIG. 5.

Figure 3B:
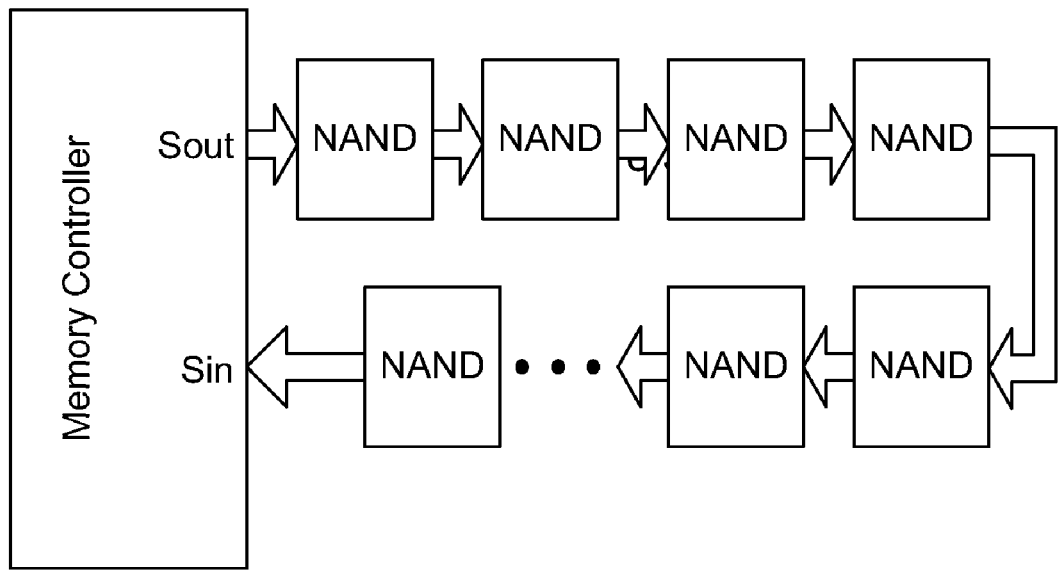
FIG. 3B is a block diagram of a serial memory system consisting of NAND flash memory devices.
Figure 3C:
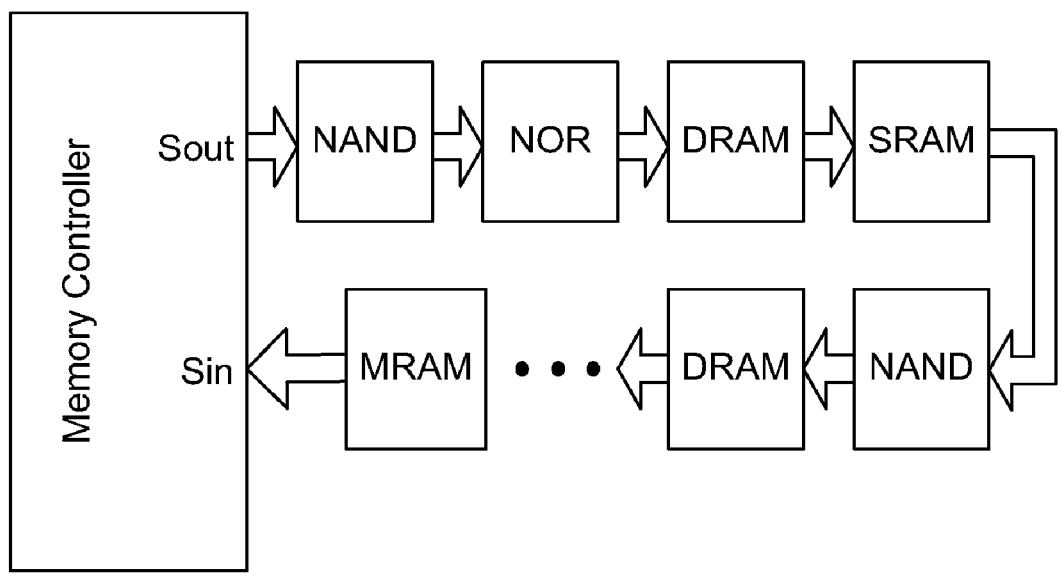
FIG. 3C is a block diagram of a serial memory system consisting of a mix of different memory devices.

FIG. 3B is a block diagram illustrating that the memory system of FIG. 3A can include one type of memory device, such as NAND flash memory devices. Each NAND flash memory device can be identical to each other or different from each other, by having different storage densities for example. FIG. 3C is a block diagram illustrating that the memory system of FIG. 3A can include a variety of types of memory devices. These memory devices can include NAND flash memory devices, NOR flash memory devices, dynamic random access memory (DRAM) devices, static random access memory (SRAM) devices and magnetoresistive random access memory (MRAM) devices for example. Of course, alternate memory devices not mentioned here can be employed in the memory system. Such a configuration having memory devices of mixed types is disclosed in U.S. Provisional Patent Application No. 60/868,773 filed Dec. 6, 2006, the disclosure of which is incorporated herein by reference in its entirety.

Figure 4:
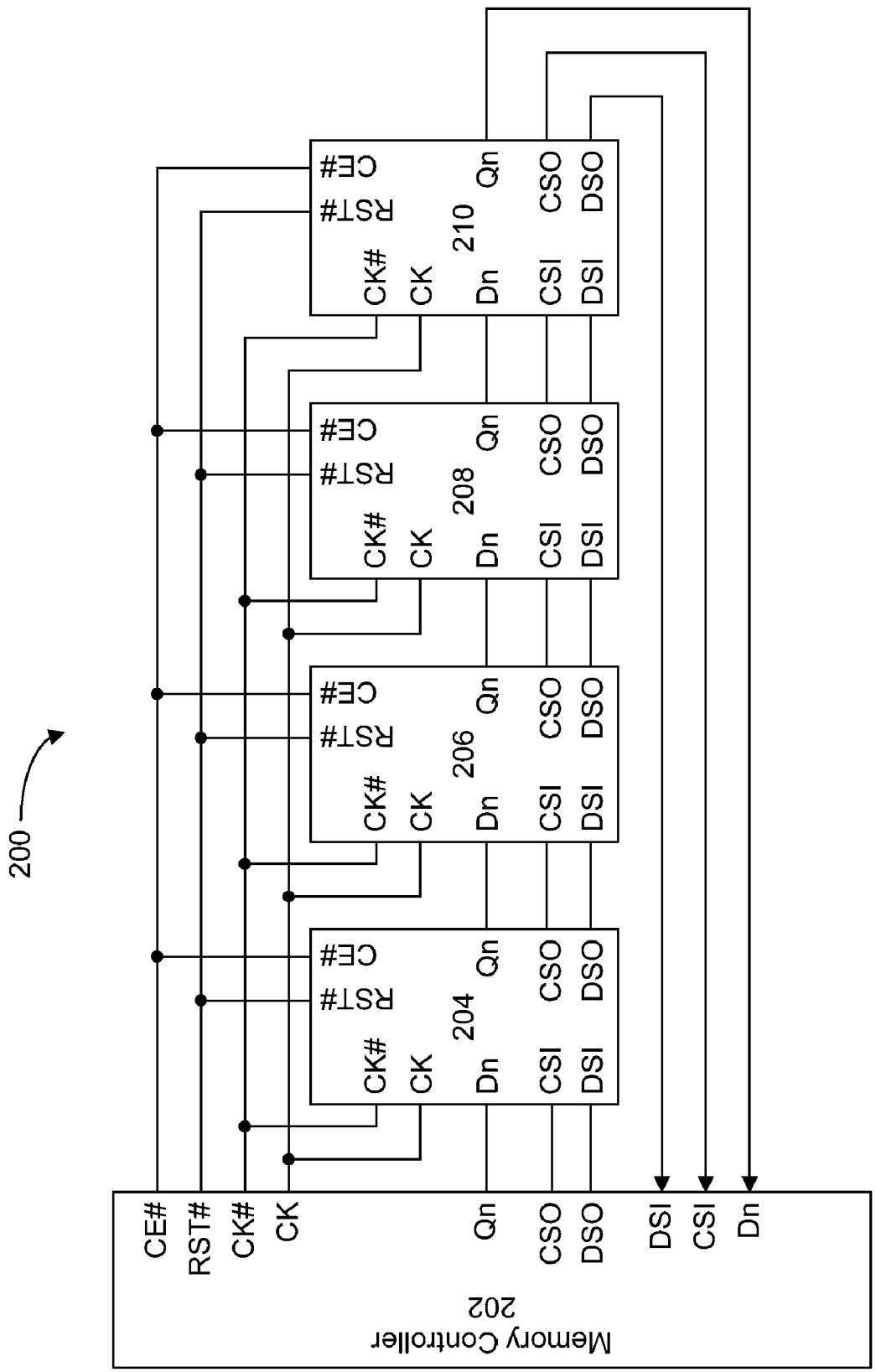
FIG. 4 is a block diagram of the serial memory system of FIG. 3A configured with a parallel clock scheme.

FIG. 4 is a block diagram of a serial memory system using a parallel clock scheme. Serial memory system 200 includes a memory controller 202 and four memory devices 204, 206, 208 and 210. The memory controller 202 provides several signals in parallel to the memory devices. These include the chip enable signal CE#, the reset signal RST#, and complementary clocks CK# and CK. In one example use of CE#, the device is enabled when CE# is at the low logic level. Once the memory device starts a program or erase operation, CE# can be de-asserted, or driven to a high logic level. In addition, CE# at the low logic level can activate the internal clock signals and CE# at the high logic level can deactivate the internal clock signals. In one example use of RST#, the memory device is set to a reset mode when RST# is at the low logic level. In the reset mode, the power is allowed to stabilize and the device prepares itself for operation by initializing all finite state machines and resetting any configuration and status registers to their default states.

The channel of memory controller 202 includes a data channel consisting of data output port Qn and data input port Dn, and a control channel consisting of a command strobe input CSI, a command strobe output CSO (echo of CSI), data strobe input DSI, and a data strobe output DSO (echo of DSI). Output port Qn and input port Dn can be one bit in width, or n bits in width where n is a non-zero integer, depending on the desired configuration. For example, if n is 1 then one byte of data is received after eight data latching edges of the clock. A data latching clock edge can be a rising clock edge for example. If n is 2 then one byte of data is received after four latching edges of the clock. If n is 4 then one byte of data is received after two latching edges of the clock. The memory device can be statically configured or dynamically configured for any width of Qn and Dn. Hence, in a configuration where n is greater than 1, the memory controller provides data in parallel bitstreams. CSI is used for latching command data appearing on the input port Dn, and has a pulse duration corresponding to the length of the command data received. More specifically, the command data will have a duration measured by a number of clock cycles, and the pulse duration of the CSI signal will have a corresponding duration. DSI is used for enabling the output port Qn buffer to output data, and has a pulse duration corresponding to the length of the read data being requested. Further details of the DSI and CSI signals will be discussed later.

In the presently shown embodiment of FIG. 4, each memory device has the same serial input/output interface, which includes an RST#, CE#, CK# and CK input ports for receiving the same named signals from the memory controller 202. Serial input/output interface further includes a data input port Dn, a data output port Qn, CSI, DSI, CSO and DSO ports. As shown in FIG. 4, the Dn, CSI and DSI input ports for each memory device are connected to the Qn, CSO and DSO output ports respectively, of a previous memory device. Accordingly, the memory devices are considered serially connected to each other as each can pass command and read data to the next memory device in the chain.

In a practical implementation of the embodiment of FIG. 4, each memory device is positioned on a printed circuit board such that the distance and signal track between input and output ports is minimized. Alternately, the four memory devices can be implemented in a system in package module (SIP) which further minimizes signal track lengths. Memory controller 202 and memory devices 204 to 210 are serially connected to form a ring topology, meaning that the last memory device 210 provides its outputs back to the memory controller 202. As such, those skilled in the art will understand that the distance between memory device 210 and memory controller 202 is easily minimized.

Figure 1:
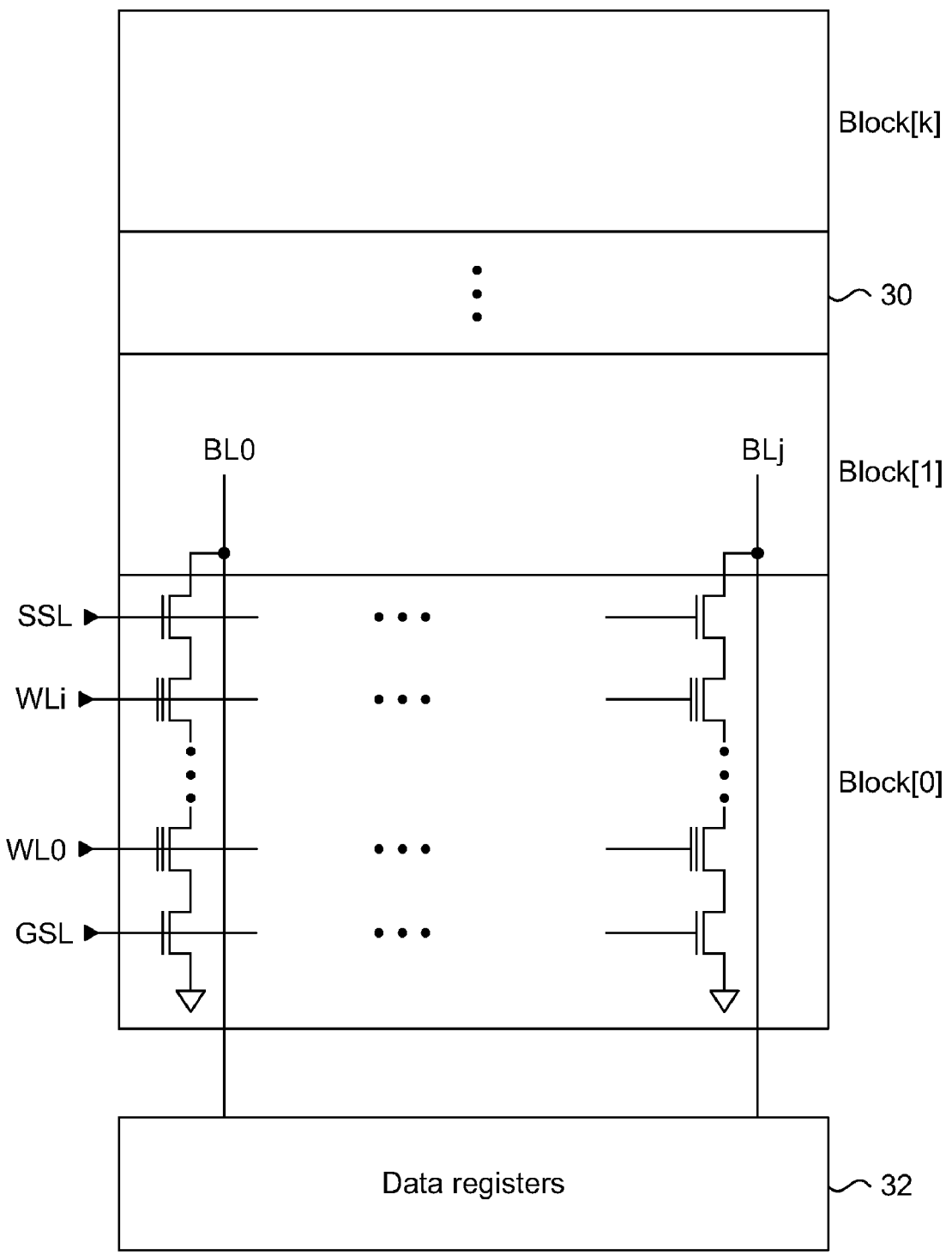
FIG. 1 is a schematic of a prior art NAND Flash memory core.
Figure 2:
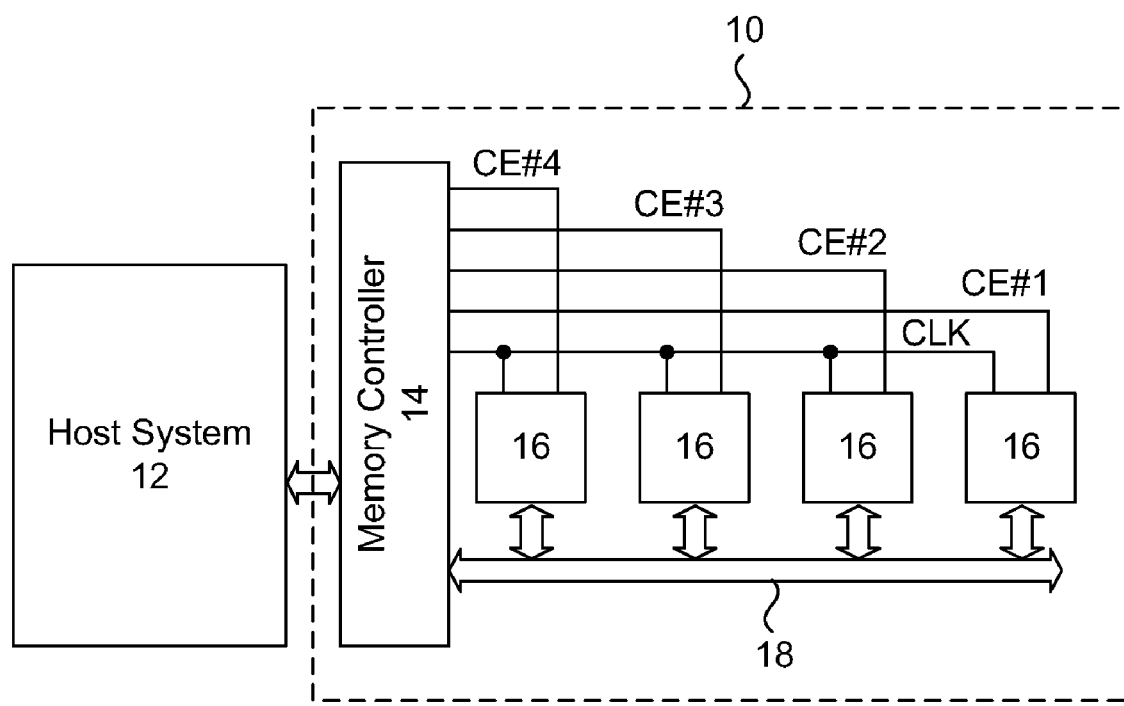
FIG. 2 is a block diagram of a prior art Flash memory system.

The performance of the memory devices in the serial memory system 200 of FIG. 4 is significantly improved over the performance of the memory devices in the prior art system of FIG. 1. For example, assuming a 66 MHz clock is used and the serial memory system 200 includes four memory devices, the data rate per pin of one of the serially connected memory devices of FIG. 4 will be about 133 Mbps. In contrast, the data rate per pin of a multi-drop memory device of FIG. 1 having four memory devices will be about 40 Mbps, given that the read cycle time (tRC) and the write cycle time (tWC) for each memory device is rated to be about 25 ns. Furthermore, the power consumption of the serial memory system 200 will be reduced relative to that of the prior art system of FIG. 1. The performance and power consumption advantage of the serial memory system 200 is primarily due to the absence of a signal track 18 that must be driven by each memory device.

A significant advantage of the serial memory system 200 of FIG. 4 is the scalability of the system. In other words, more than four memory devices can be included in the memory chain connected to the memory controller 202 without any degradation in performance. In contrast, the prior art system of FIG. 1 will reach a practical limitation with diminishing returns as more memory devices are added, because the length of the signal tracks of channel 18 is necessarily increased to accommodate the additional devices. Additional pin loading to the signal tracks is contributed by the additional devices. As previously mentioned, the clock frequency must be reduced in order to ensure data transmission integrity when driving a long channel 18, which degrades performance. In the embodiment of FIG. 4, the distribution of the clock will be designed to accommodate a large number of memory devices, and can include repeaters and a balanced tree to maintain clock integrity for all memory devices. Those skilled in the art will understand that there are many ways to provide a balanced clock signal.

Figure 5:
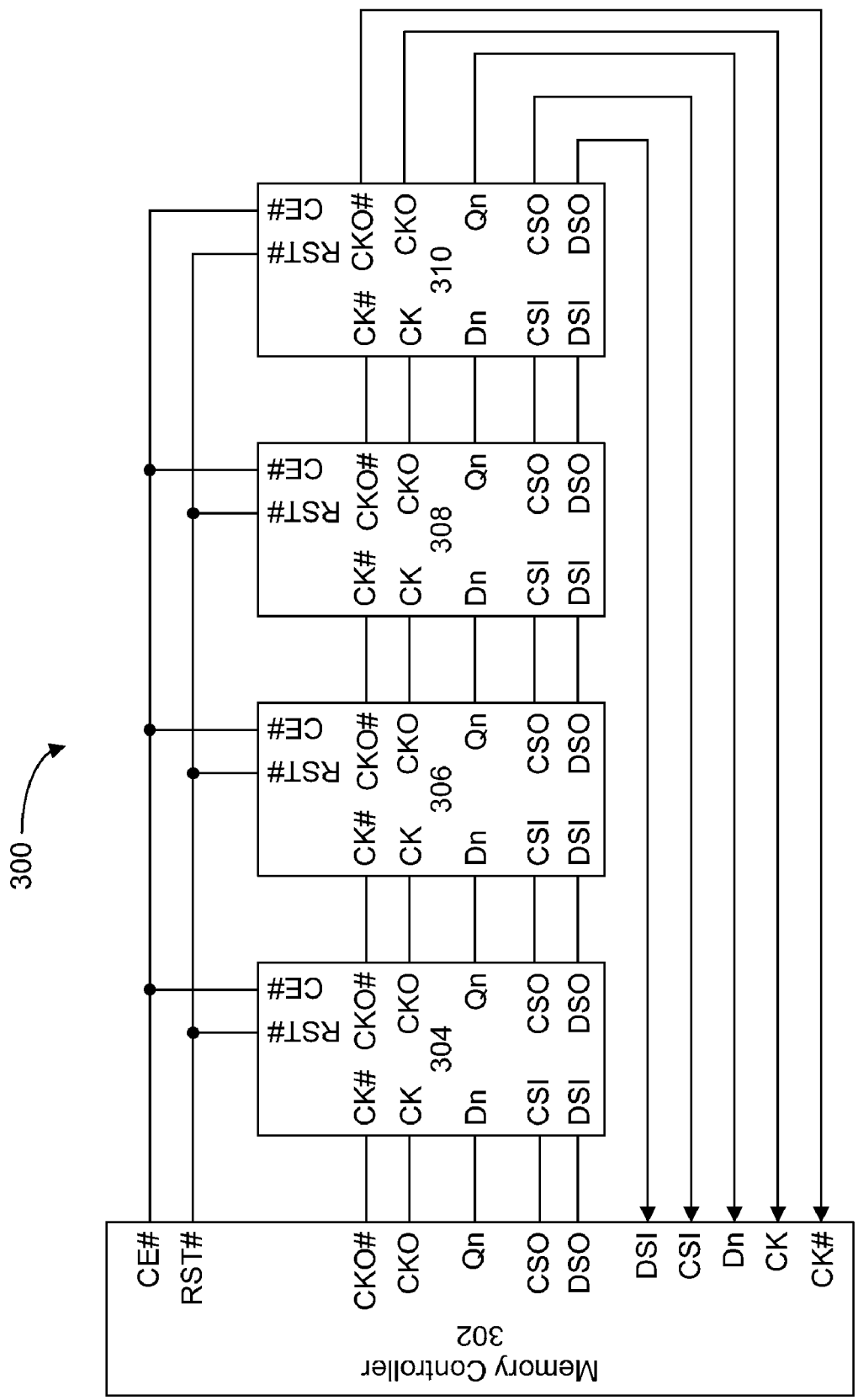
FIG. 5 is a block diagram of the serial memory system of FIG. 3A configured with a source synchronous clock scheme.

While the serial memory system embodiment of FIG. 4 provides significant performance advantages over the prior art memory system, further performance improvements are obtained by using the alternate serial memory system embodiment of FIG. 5. The serial memory system 300 of FIG. 5 is similar to the embodiment of FIG. 4, except that instead of a parallel clock distribution scheme, a source synchronous clock scheme is used. Serial memory system 300 includes a memory controller 302 and four memory devices 304, 306, 308 and 310. The memory controller 302 includes clock output ports CKO# and CKO for providing complementary clock signals, and clock input ports CK# and CK for receiving the complementary clock signals from the last memory device of the system. The memory devices are the same as those shown in FIG. 4, except that they now have clock input ports CK# and CK, and clock output ports CKO# and CKO, where the received clocks by one memory device at its CK# and CK ports is provided to the next device through its CKO# and CKO ports. The last memory device 310 provides the clock signals back to the memory controller 302.

The main advantage of the embodiment of FIG. 5 is the absence of any complex clock distribution scheme and the minimum clock interconnection between memory devices. Therefore, the minimum clock frequency can be increased to 166 MHz, resulting in a minimum 333 Mbps data rate per pin. As with the embodiment of FIG. 4, the embodiment of FIG. 5 can be scaled to include any number of memory devices. For example, a fifth memory device can be added to the embodiment of FIG. 5 simply by connecting the output ports of memory device 310 to the corresponding input ports of the fifth memory device, and connecting the output ports of the fifth memory device to the memory controller 302. Those skilled in the art will understand that memory controller 302 can include a simple phase locked loop (PLL) circuit to maintain the clock frequency.

The configurations of serial memory system 200 and 300 can be statically fixed for a specific number of memory devices. Different configurations can be set for providing different memory system capacities, simply by adjusting the number of memory devices in the serial chain. In alternate embodiments, memory devices having different capacities can be mixed together in the serial chain, thereby providing more flexibility in the overall memory system capacity. There may be applications where the memory system capacity can be dynamically adjusted by adding or removing modules from the serial chain, where a module can be a single memory device, an SIP memory, or a PCB having memory devices and/or SIP memory devices.

Figure 6:
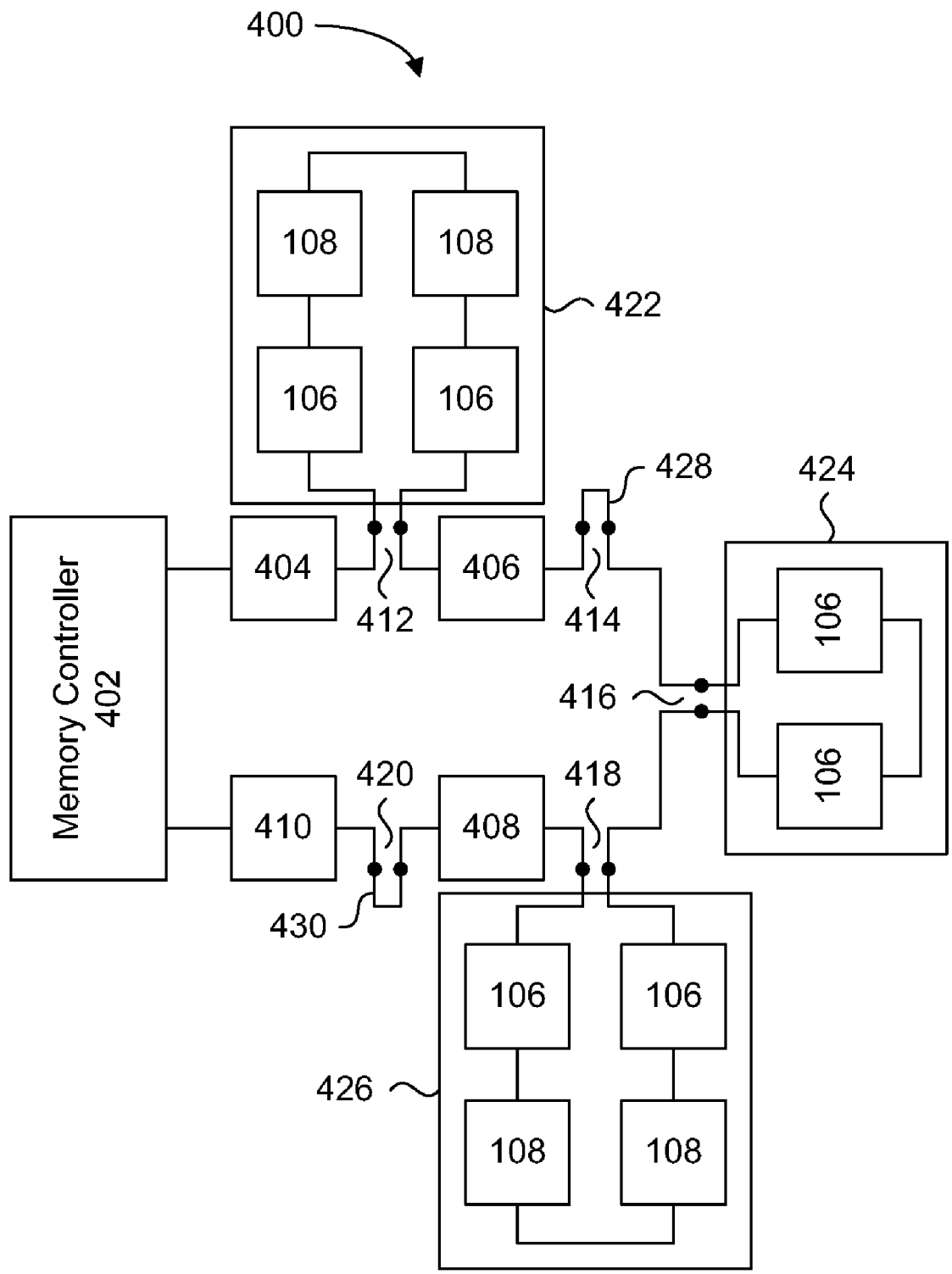
FIG. 6 is a block diagram of a dynamically adjustable serial memory system.

FIG. 6 is a block diagram illustrating a dynamically adjustable serial memory system embodiment. Adjustable serial memory system 400 includes a memory controller 402, fixed memory devices 404, 406, 408 and 410, expansion links 412, 414, 416, 418 and 420, and expansion modules 422, 424 and 426. Fixed memory devices 404, 406, 408 and 410 are serially connected to each other, to intervening expansion links, and to the memory controller 402. Each expansion link is a male or female coupling means for releasably receiving and retaining a module having a corresponding female or male coupling means. Each module includes at least one memory device serially connected with the terminals of the expansion link. In the presently shown example, expansion modules 422 and 426 each include four memory devices that are serially connected between input connectors and output connectors of the module coupling means. Module 424 includes two memory devices serially connected between input connectors and output connectors of its module coupling means. Therefore, by inserting the module into an expansion link, additional serially connected memory devices can be dynamically inserted between fixed memory devices. Unused expansion links, such as expansion links 414 and 420 will have suitably configured jumpers 428 and 430 connected thereto for maintaining a continuous serial electrical connection of the chain.

The adjustable serial memory system 400 can include any number of fixed memory devices and expansion links, and the memory modules can be configured to include any number of serially connected memory devices. Therefore, the adjustable serial memory system 400 has a fully expandable in memory capacity simply by adding new modules or replacing existing modules with larger capacity modules, without impacting overall performance. There is no requirement to change the memory controller, since the same channel is being populated with additional serially connected memory devices, and those skilled in the art will understand how to connect parallel control signals such as CE#, RST# and power supplies to the inserted modules. After insertion of the modules, or removal of modules, the memory system 400 is re-initialized so that the memory controller can automatically set device ID's for the memory devices in the system.

The serial memory systems shown in FIGS. 3A to 3C and 4 to 6 employ memory devices, such as flash memory devices, having compatible serial input/output interfaces. An example of a flash memory device having a serial input/output interface is described in commonly owned U.S. patent application Ser. No. 11/324,023, filed on Dec. 30, 2005. Accordingly, the memory devices shown in the embodiments of FIGS. 3A to 3C and 4 to 6 can employ the flash memory devices disclosed in these patent applications. However, the serial input/output interface described in these patent applications are examples of a serial interface that can be used. Any serial input/output interface facilitating serial operation between memory devices can be used, provided it is configured for accepting a predetermined command structure.

Figure 7:
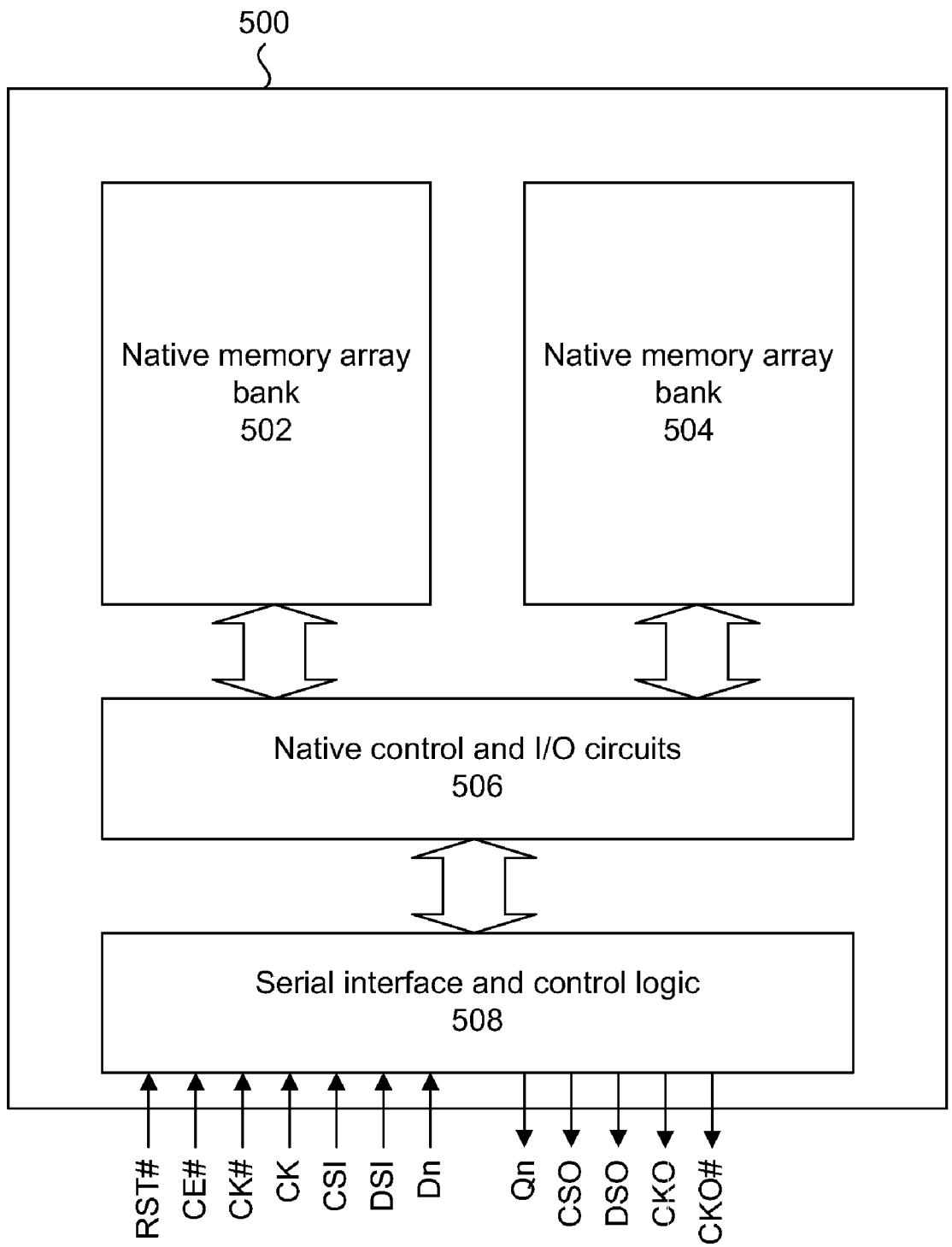
FIG. 7 is a block diagram of a memory device having a native core and a serial input/output interface suitable for use in the serial memory systems of FIGS. 3A to 3C and 4 to 6.

According to another embodiment, the serial input/output interface can be used with any type of memory device. More specifically, other memory types can be adapted to operate with the serial input/output interface. FIG. 7 is a block diagram illustrating the conceptual organization of a generic memory device having a native core and a serial input/output interface suitable for use in the serial memory systems of FIGS. 3A to 3C and 4 to 6. Memory device 500 includes a native memory core, which includes memory array banks 502 and 504, and native control and I/O circuits 506 for accessing the memory array banks 502 and 504. Those skilled in the art will understand that the memory array can be organized as a single memory bank or more than two memory banks. The native memory core can be DRAM, SRAM, NAND flash, or NOR flash memory based for example. Of course, any emerging memory and its corresponding control circuits can be used. Accordingly, depending on the type of native memory core, circuit block 506 can include error correction logic, high voltage generators, refresh logic and any other circuit blocks that are required for executing the operations native to the memory type.

Typically, memory devices use command decoders for initializing the relevant circuits in response to a received command by asserting internal control signals. They will also include well known I/O circuitry for receiving and latching data, commands and addresses. According to the present embodiment, the existing I/O circuits are replaced with the serial interface and control logic block 508. In the present example, the serial interface and control logic block 508 receives RST#, CE#, CK#, CK, CSI, DSI and Dn inputs, and provides Qn, CSO, DSO, CKO and CKO# outputs, which matches the input and output ports of the memory devices shown in FIG. 5.

The serial interface and control logic block 508 is responsible for various functions, as discussed in U.S. patent application Ser. No. 11/324,023. The notable functions of serial interface and control logic block 508 being setting a device identifier number, passing data through to the next serially connected memory device, and decoding a received command for executing native operations. This circuit can include a command decoder that replaces the native command decoder, which is configured to assert the same control signals that the native command decoder would have asserted, in response to a serially received command corresponding to the native command. The command set can be expanded to execute features usable by the memory controller when the memory devices are serially connected. For example, status register information can be requested to assess the status of the memory device.

Therefore, the serial memory systems of FIGS. 3A to 3C and 4 to 6 can include a mix of memory device types, each providing different advantages for the greater system. For example, the high speed of DRAM memory can be used for caching operations while the non-volatility of flash memory can be used for mass data storage. Regardless of the type of memory device being used, each memory device is individually addressable to act upon a command because the serial interface and control logic block 506 is configured to receive commands according to a predetermined protocol.

According to another embodiment, these commands consist of command packets having a modular command structure, which are used for controlling the individual memory devices of the serial memory system. In the proposed command structure, specific commands can be issued to a memory device at different times as individual command packets. A command packet can initiate a specific operation for a first memory bank, and a subsequent command packet can then be received for initiating another operation for a second memory bank while core operations are being executed in response to the first command packet. Further command packets can be received for completing the operations for the first memory bank and the second memory bank in a similar interleaved manner. This is referred to as executing concurrent operations in the memory device. Prior to discussing concurrent operations, an explanation of the modular command protocol follows. Further details of the modular command protocol are described in commonly owned U.S. Provisional Patent Application Ser. No. 60/892, 705 filed on Mar. 2, 2007 and titled "Modular Command Structure in Memory System and its Use".

Figure 8:
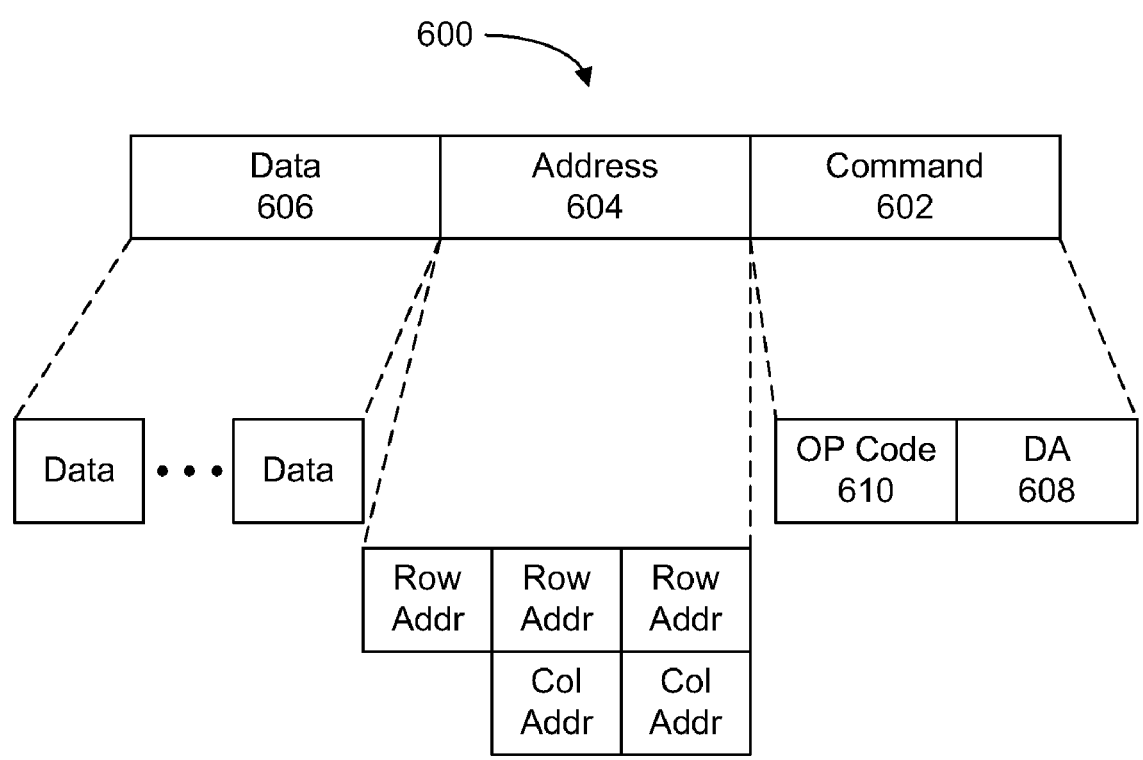
FIG. 8 is an illustration of a modular command packet structure.

The command packet 600 has the structure illustrated in FIG. 8, and includes three fields, two of which are optional depending on the specific command being issued by the memory controller. The first field, being a mandatory field, is the command field 602. The first optional field is an address field 604, and the second optional field is a data field 606.

The command field 602 includes two sub-fields, the first being a device address (DA) field 608 and the second being an op-code (OP Code) field 610. The device address field 608 can be any number of bits in length, and is used for addressing each memory device in the system. For example, a device address field 608 of 1 byte in length is sufficient for addressing up to 256 memory devices. One address can be reserved for addressing all memory devices simultaneously for broadcasting an operation. In an alternate embodiment, the device address field 608 can include a device type field to indicate the type of memory device the op-code field 610 is directed to. For example, the device type field can designate a DRAM, SRAM or flash memories. The op-code field 610 can be any number of bits in length to represent the commands for any number of memory devices, and can include a bank address. For example, the flash memory command set will have different commands than a DRAM command set, hence the op-code field will be configured to accommodate all possible commands from both command sets if the memory system includes both types of memory devices. The address field 604 is used for providing either a row address (Row Addr) or a column address (Col Addr) of a memory array, depending on the type of operation specified by the op-code. The data field 606 will include any number of bits of data to be written or programmed to the memory device. Therefore, the command packets 600 will vary in size since write data may not be required for a particular operation and both addresses and write data may not be required for a particular operation.

FIG. 9 lists example command packets which can be used for operating a flash memory device having the configuration shown in FIG. 7, for use in the previously described serial memory system. The byte positions in FIG. 9 correspond to the order they are serially received by the memory device. The command field 602 occupies the first and second byte positions, which includes the device address (DA) as the first byte of information and an op-code corresponding to the operation as the second byte of information. The address field 604 can include a three-byte row address (RA) occupying the third to fifth byte positions, but will be shortened for other commands to include a two-byte column address (CA) occupying only the third and fourth byte positions. For commands including a two-byte column address, the data field 606 will occupy the fifth bit position to the $2116^{th}$ bit position, if the data should be that length. The data can occupy fewer or more byte positions.

Any command packet 600 issued by the memory controller will be received serially by each memory device in the system, and only the memory device having a device address matching the DA sub-field 608 of the command field 602 will act upon the op-code sub-field 610. Otherwise, the command packet is passed through the memory device and to the next memory device in the chain. Since the op-code is specific to a particular operation, the memory device, and more specifically the serial interface and control logic block 508 of the memory device 500, will control the required circuits for latching address and/or data information of the command packet. For example, if a page read command packet is received by the designated memory device, the designated memory device will decode the op-code and control the appropriate circuits to latch the following three byte row address.

The example command packets listed in FIG. 9 are directed to flash memory operations. A set of command packets for any other type of memory device having different operations can be configured to follow the described command structure.

The previously described command packets can be advantageously used for executing concurrent operations in a memory device, such as memory device 500 of FIG. 7. If the memory device 500 is configured for accessing any of its banks independently, then substantially concurrent operations can be executed within the memory device. Independent access means that core operations for different memory banks can proceed independently of each other. An example of such a memory device is described in previously mentioned U.S. patent application Ser. No. 11/324,023. Core operations refers to logical or functional operations which are not to be interrupted since the completion of a core operation may depend on a particular sequence of events executed under the control of a state machine or other logic.

Concurrent operations will increase performance of the system since the memory controller does not need to wait until the memory device has fully completed the first operation before sending the command packet for the second operation. In traditional NAND flash memory devices, the memory device will not accept another command, or respond to a received command for a different memory bank until the core operations are completed for the current memory bank. Hence the memory device will execute several operations in series before accepting another command. In a concurrent operation of the present embodiment, one command packet will initiate an operation in one memory bank, and a subsequent command packet will immediately initiate another operation in a second memory bank of the same memory device while core operations are being executed for the first memory bank. Therefore, both operations will be executed almost simultaneously by the two memory banks.

Figure 10:
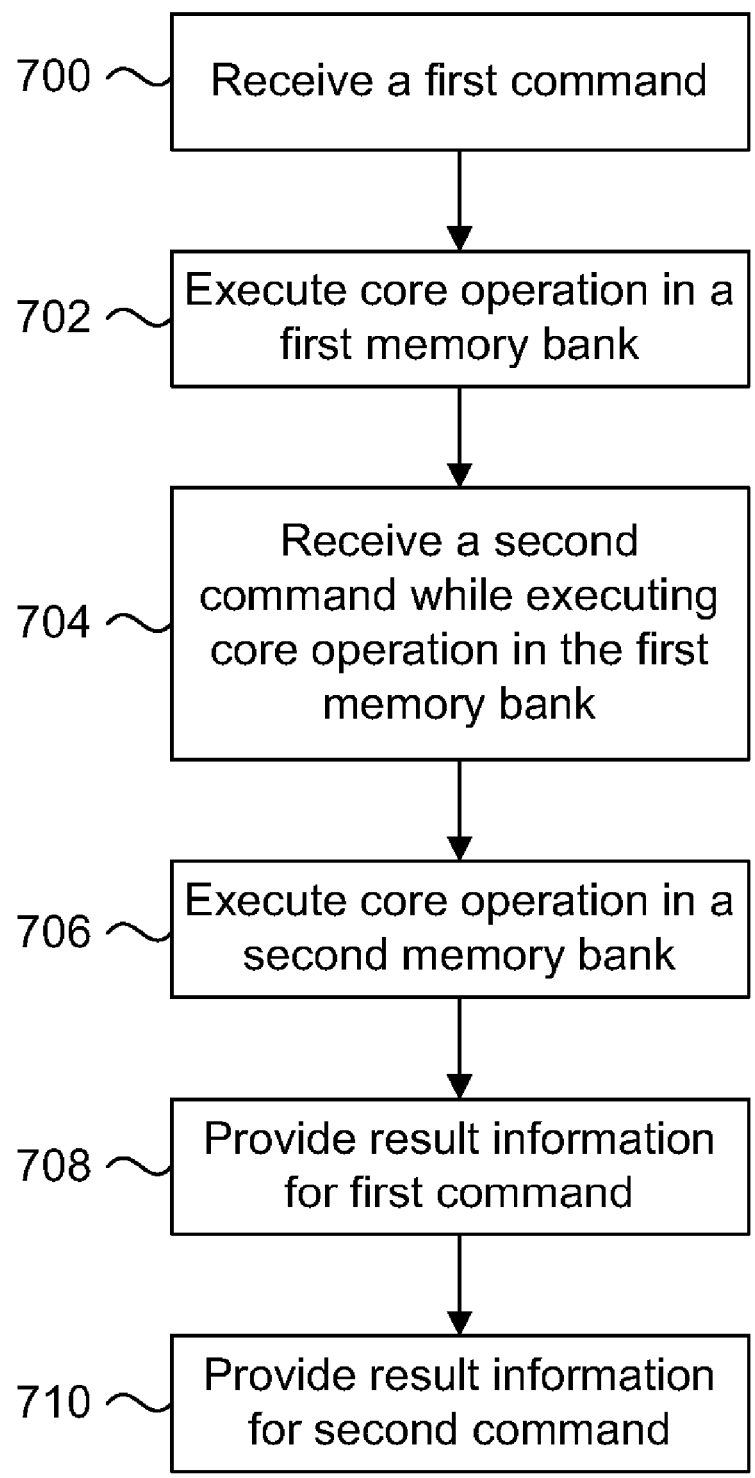
FIG. 10 is a flow chart of a method for executing concurrent operations in one memory device.

FIG. 10 is a flow chart illustrating a method for executing concurrent operations in one memory device, such as memory device 500 which is configured for independent access of its memory banks. Starting at step 700, a first command is issued by the memory controller and received by the memory device. The first command can be any one of the command packets previously described and shown in FIG. 9. Once the entire packet (command field, address field and data field) has been received, core operations will begin at step 702 for the first memory bank of the memory device. Occurring almost simultaneously with the initiation of the first memory bank core operations, a second command is issued by the memory controller and received by the memory device at step 704.

At step 706 the core operations of the second memory bank are executed in response to the second command. Eventually, result information pertaining to the first command will be provided at step 708. Result information can include status information or read data, which is provided in response to a supplemental read command packet. Status information provides an indication of the success or failure of a particular type of operation, such as a program or erase operation, and is read from a status register associated with that memory bank in response to a supplemental "read status" command packet issued by the memory controller. Read data is provided in response to a supplemental "burst read" command packet. With reference to FIG. 1, the core operation for a read operation will include outputting a page of data read from a block of the memory bank to the data registers block 32. To read the data from the data registers block 32, a burst read operation is executed. At step 710, result information pertaining the second command will be provided. The result information from both memory banks are eventually returned to the memory controller. The embodiment of FIG. 10 illustrates the concurrent operation of two memory banks, but the method is applicable to the concurrent operation of two or more memory banks of the memory device.

FIGS. 11 to 15 are sequence diagrams illustrating example concurrent operations executable by a flash memory device of the type described in U.S. patent application Ser. No. 11/324, 023. FIGS. 11 to 15 show signal traces for CSI, Dn, DSI, and Qn over time for one memory device of FIG. 4 or 5. The illustrated sequences are intended to illustrate relative timing between signals, and not intended to represent specific timing values. It is noted that the command strobe input CSI is generated by the memory controller and acts as an indicator for the length of the command assembled and issued by the memory controller. For example, if the command packet being issued is two bytes in length, then the corresponding CSI has an active edge (a rising edge in this example) corresponding to the first bit of the command and an inactive edge corresponding to the last bit of the command packet. The CSI signal controls the memory device command registers to latch the command data. The data strobe input signal DSI is also generated by the memory controller, and acts as an indicator for the length of the data being provided by the memory device. For example, if the read data requested by the memory controller is eight bytes in length, then the corresponding DSI generated by the memory controller will have an active edge corresponding to the first bit of the read data and an inactive edge corresponding to the last bit of the read data. CSI and DSI are generated by the memory controller as it has knowledge of the issued command bit length and the requested read data bit length.

Figure 11:
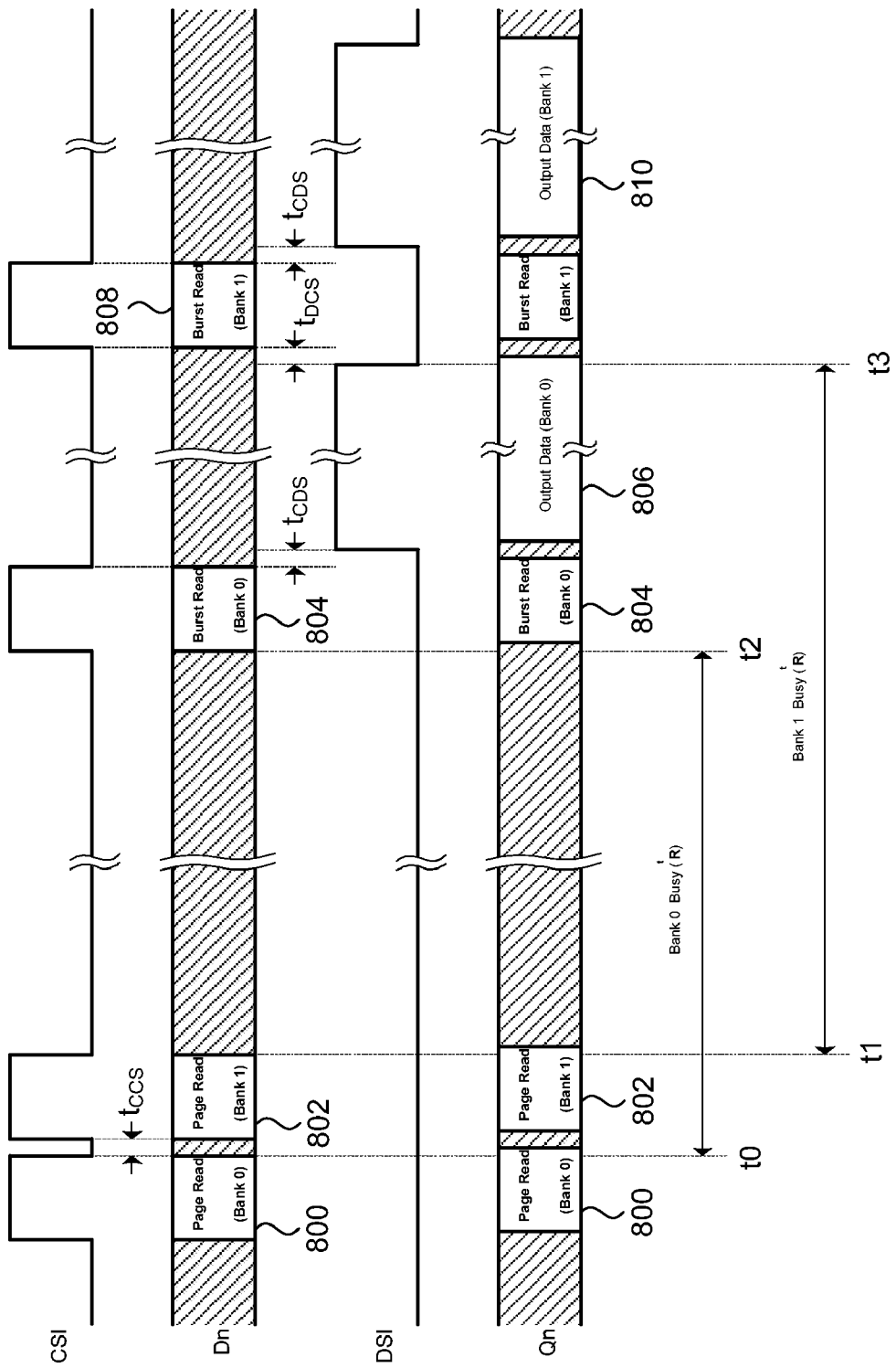
FIG. 11 is a sequence diagram illustrating a concurrent read operation for two different banks of a memory device.

FIG. 11 is a sequence diagram illustrating a concurrent read operation for two different banks of the memory device. A page read command packet 800 for bank 0 is latched by the memory device when CSI is at the high logic level. As shown in FIG. 9 for example, the page read command includes a two-byte command and a three-byte row address. Bank 0 of the memory device will begin executing the read operation for the designated row address after CSI falls to the low logic level, at time t0. By example, a read operation for a flash memory device will include activation of a wordline, such as WLi in FIG. 1, and sensing of the bitline data of BL0 to BLj. Eventually, the sensed data is latched or stored in data register block 32. In one embodiment, the page read command packet 800 is passed on to the next memory device through its Qn output port. In another embodiment, the page read command packet 800 is inhibited from being passed on to further memory devices since the present command packet 800 is addressed to the current memory device. For example, the page read command packet 800 provided on the Qn output can be set to a null value after being latched in the command registers. This will conserve power since no rail-to-rail signal switching of the signal line is required.

A page read command packet 802 for bank 1 is latched by the memory device when CSI is at the high logic level. Bank 1 of the memory device will begin executing the read operation for the designated row address after CSI falls to the low logic level, at time t1. Now, concurrent operations are being executed by memory banks 0 and 1. After a specific number of clock cycles, the data is ready to be read out from bank 0 at time t2. To read out the data from bank 0, the memory controller issues a burst read command packet 804, which is received and latched when CSI is at the high logic level. As shown in FIG. 9, the burst read command packet will include a column address from which data is to be read. After CSI corresponding to the command packet 804 falls to the low logic level, DSI will rise to the high logic level to enable the Qn output port buffer, thereby providing the output data for bank 0 as read data packet 806. In the example using FIG. 1 again, the outputting of the data on the Qn output buffer can correspond to reading out data from the data register block 32 beginning at the column address specified in the burst read command packet 804 and ending when DSI falls to the low logic level. By the time the last bit of output data for bank 0 is output, the data for bank 1 will be ready for read out at time t3. After DSI falls to the low logic level, a burst read command packet 808 for bank 1 is received and latched by the memory device. Following the falling edge of CSI for burst read command packet 808, DSI is driven to the high logic level again for a predetermined duration in order output the read data from bank 1 on the Qn output port as read data packet 810.

Because the core operations of bank 0 between t0 and t2 and the core operations of bank 1 between t1 and t3 are substantially concurrent and overlap with each other, the total core operation time for both read operations is between times t0 and t3. In the prior art, both core operations are executed in sequence, meaning that core operations for bank 1 begin in response to the second page read command packet that is received after the core operations for bank 0 are completed at t2. The performance advantage of executing concurrent operations as previously shown should be apparent to those skilled in the art.

Figure 12:
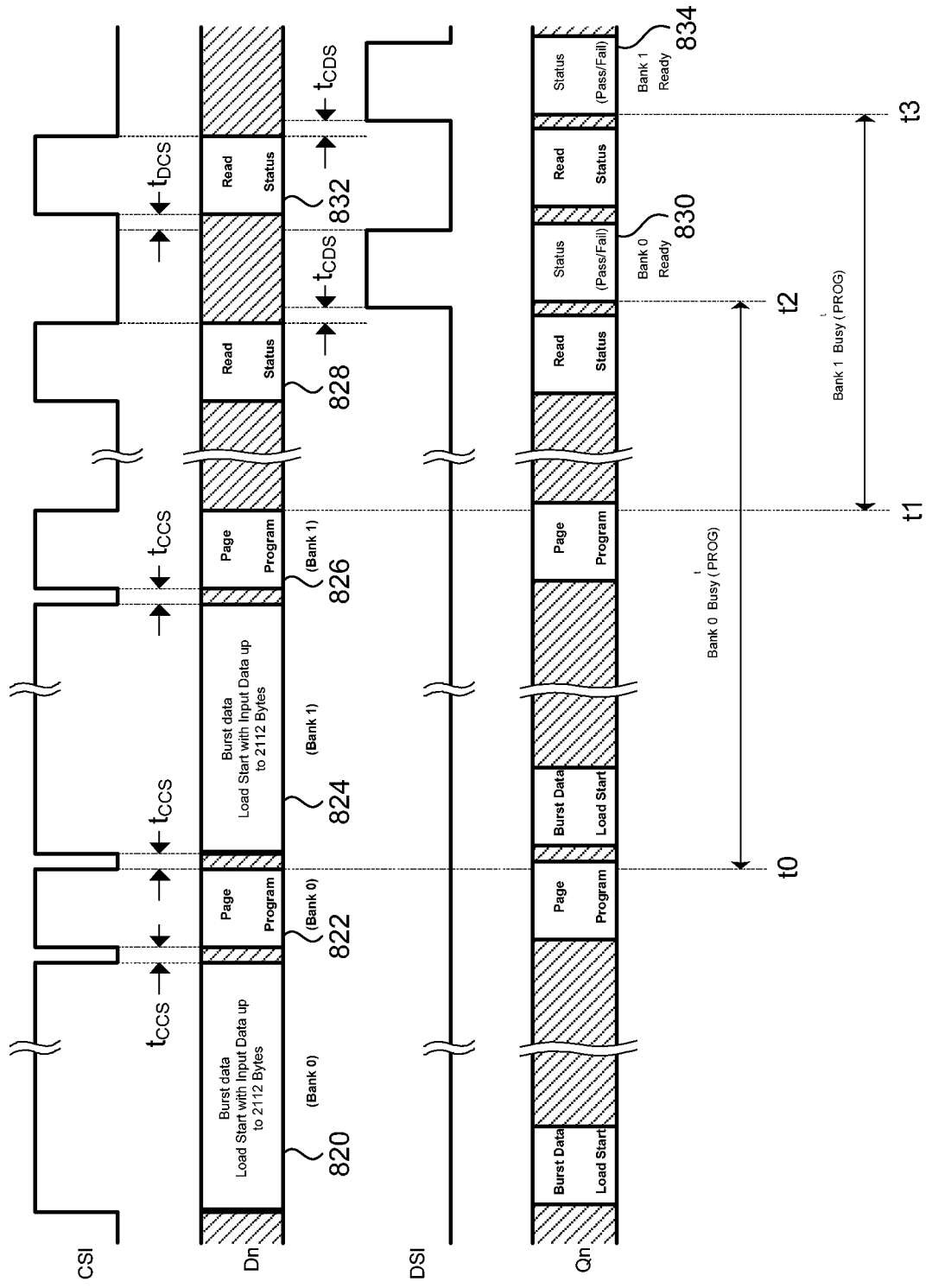
FIG. 12 is a sequence diagram illustrating a concurrent program operation for two different banks of a memory device.

FIG. 12 is a sequence diagram illustrating a concurrent program operation for two different banks of the memory device. It is noted from this point forward that command packets received at the Dn input port of the memory device are passed to its Qn output port, which is illustrated in the Qn signal trace of FIGS. 11 to 15. To program a memory bank, program data is first loaded into data registers of the memory device based on a specific column addresses, and then programmed to specific rows. In FIG. 12, a burst data load command packet 820 for bank 0 is received with the program data, followed shortly after by a page program command packet 822. Both command packets 820 and 822 are latched when CSI is at the high logic level. After the page program packet 822 is latched, and decoded by the memory device, core operations for programming the data to bank 0 begins at time t0. Now a burst data load command packet 824 for bank 1 is received with the program data, followed shortly after by a page program command packet 826. After the page program packet 826 is latched, and decoded by the memory device, core operations for programming the data to bank 1 begins at time t1.

If so desired, the memory controller can request the status of the memory device by issuing a read status command packet 828. This will access the status register of the memory device, whose data will be output on the Qn output port as read data packet 830 when DSI is at the high logic level. Those skilled in the art will understand that the status register is updated internally by the memory device as internal operations are executed. In the present example, the read data packet 830 will indicate that programming to bank 0 has been completed. A subsequently issued read status command packet 832 will result in read data packet 834 providing the value of the status register, which can indicate that programming to bank 1 has been completed. Once again, since the core programming operations of banks 0 and 1 are substantially concurrent and overlap, significant time is saved when compared to a sequential programming of the two banks.

Figure 13:
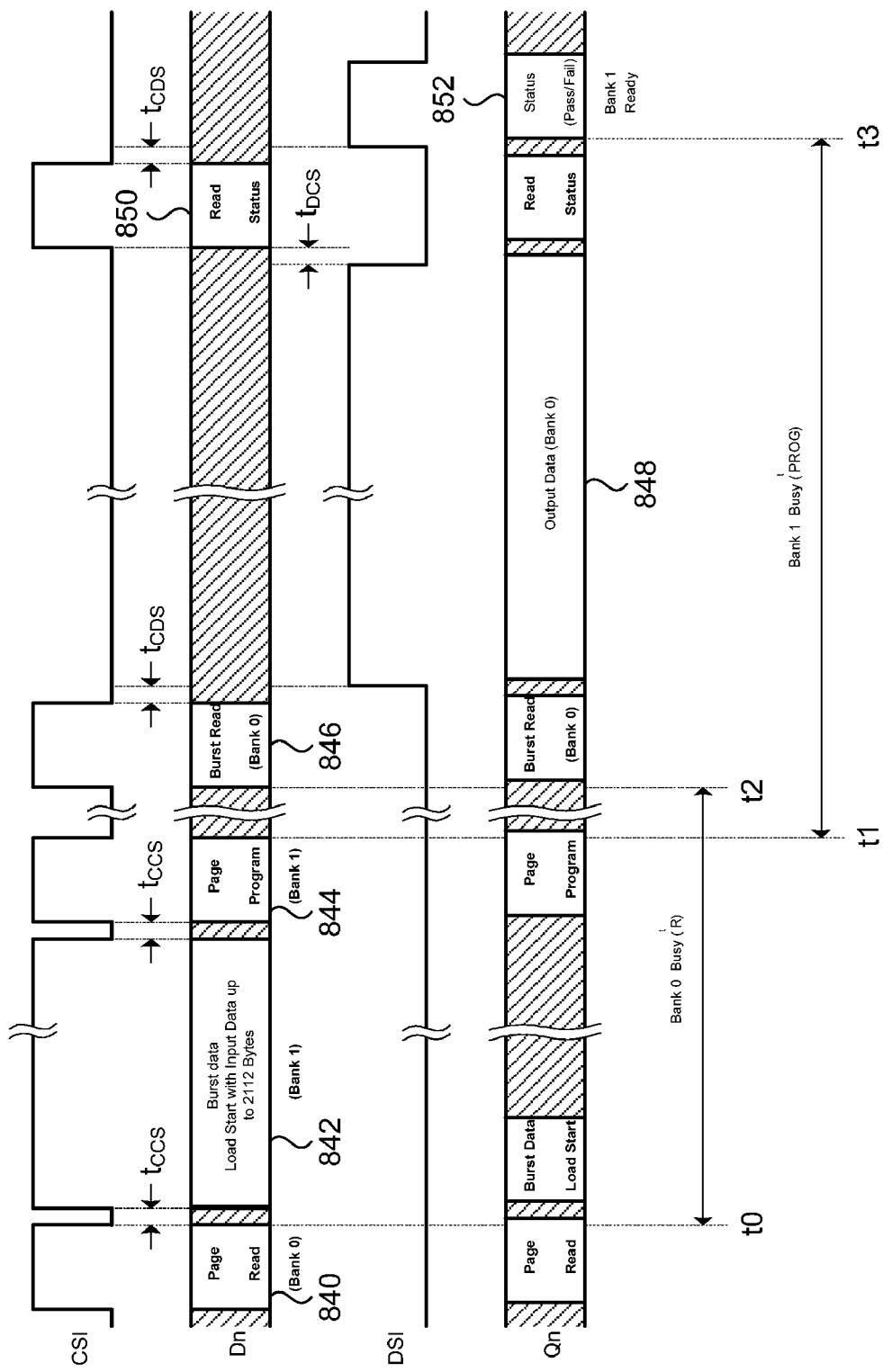
FIG. 13 is a sequence diagram illustrating a concurrent read and program operation for two different banks of a memory device.

FIG. 13 is a sequence diagram illustrating a concurrent read and program operation for two different banks of the memory device. A page read command packet 840 for bank 0 is latched by the memory device, followed by a burst data load start command packet 842 for bank 1, which is then followed by a page program command packet 844 for bank 1. At time t0, core operations for reading data from bank 0 begin, while at time t1, core operations for programming data to bank 1 begin. Because the core operations for the page read operation of bank 0 was initiated first, the data will be ready at time t2 while core operations for programming data to bank 1 is in progress. Therefore, a burst read command packet 846 is received, and DSI is asserted to output the read data from bank 0 in read data packet 848. After DSI is de-asserted to end output of the read data from bank 0, a read status command packet 850 can be issued to check the programming status of bank 1. Since bank 1 should have completed the programming operation at time t3, DSI is asserted again, and read data packet 852 is provided on the Qn output port, indicating the pass or fail status of the programming operation to bank 1.

Figure 14:
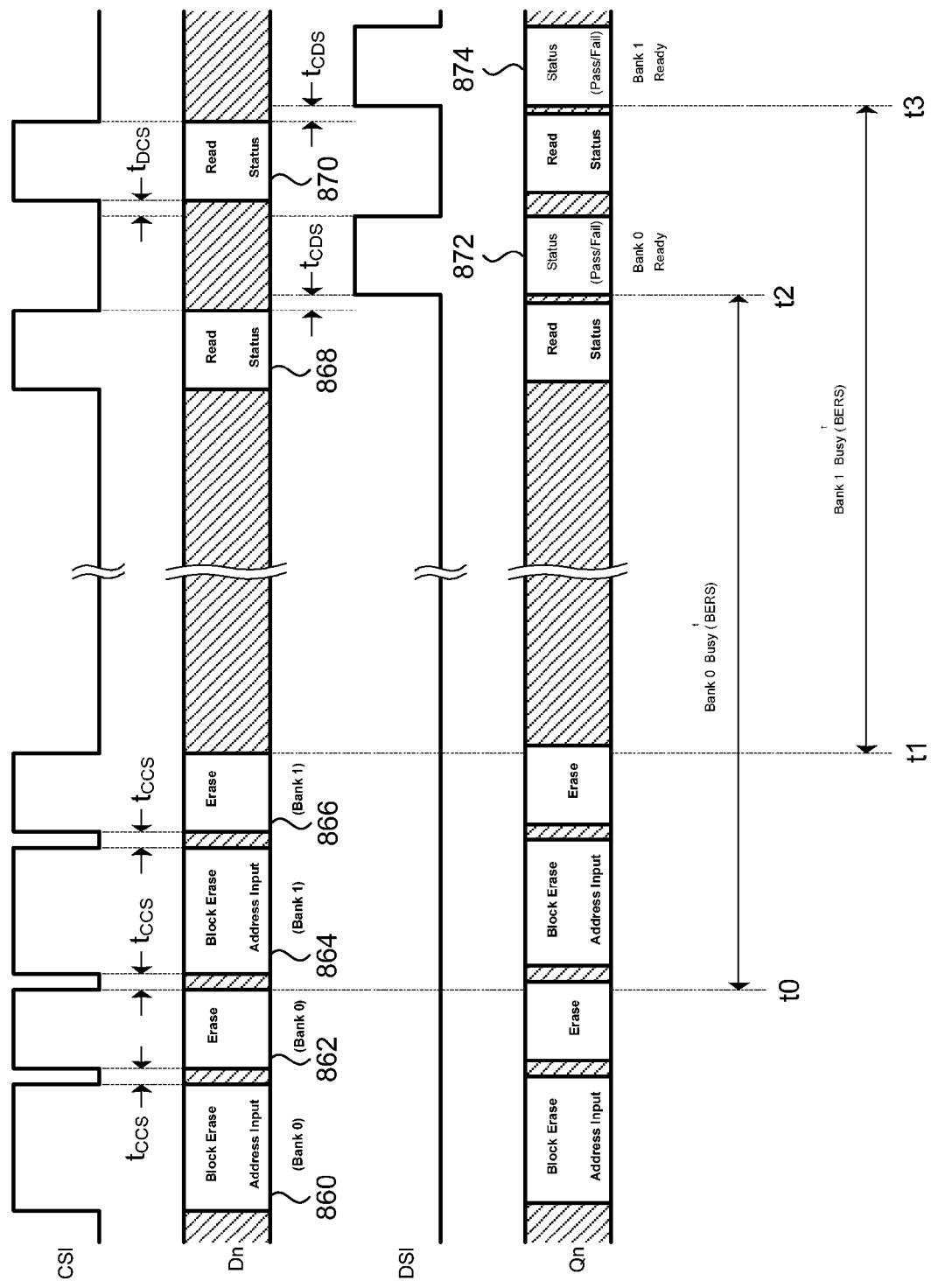
FIG. 14 is a sequence diagram illustrating a concurrent block erase for two different banks of a memory device.

FIG. 14 is a sequence diagram illustrating a concurrent block erase for two different banks of the memory device. A block erase address input command packet 860 for bank 0 is latched by the memory device, followed by an erase command packet 862 for bank 0. After the erase command packet 862 is latched, core operations for bank 0 begin at time t0. Now a block erase address input command packet 864 for bank 1 is latched by the memory device, followed by an erase command packet 866 for bank 1. After the erase command packet 866 is latched, core operations for bank 1 begin at time t1. The structure of the block erase address input command and the erase command are shown in FIG. 9. If the erase operation for bank 0 should be completed at time t2, and that of bank 1 should be completed at time t3, then separate read status command packets 868 and 870 can be issued and latched by the memory device. Corresponding read data packets 872 and 874 are provided on the Qn output port of the memory device, each providing the value of the status register.

In the sequence diagrams of FIGS. 11 to 14, different combinations of concurrent operations have been illustrated. An advantage of the modular command packet structure described in the previous embodiments is that different command packets can be issued at different times. As previously shown, a burst data load command packet is followed immediately by a page program command packet. However, this is not necessarily the case all the time, and the page program command packet can be issued later if desired. When the command packets are used in combination with the command strobe signal CSI and data strobe signal DSI, a further advantage is realized, and that is the ability to suspend an operation of the memory device. As previously mentioned, the CSI strobe signal is provided by the memory controller for indicating that the command data on the Dn input port is to be latched by the command registers, and can have a duration corresponding to the length of the command packet being issued. Since input data for programming a memory bank and output data read from a memory bank can be over 1000 bytes in length, those skilled in the art will appreciate that a relatively long time is required for inputting or outputting such quantities of data. According to the present embodiment, the CSI and DSI strobe signals can be prematurely de-asserted while program data is loaded or read data is output, and resumed at a later time.

Figure 15:
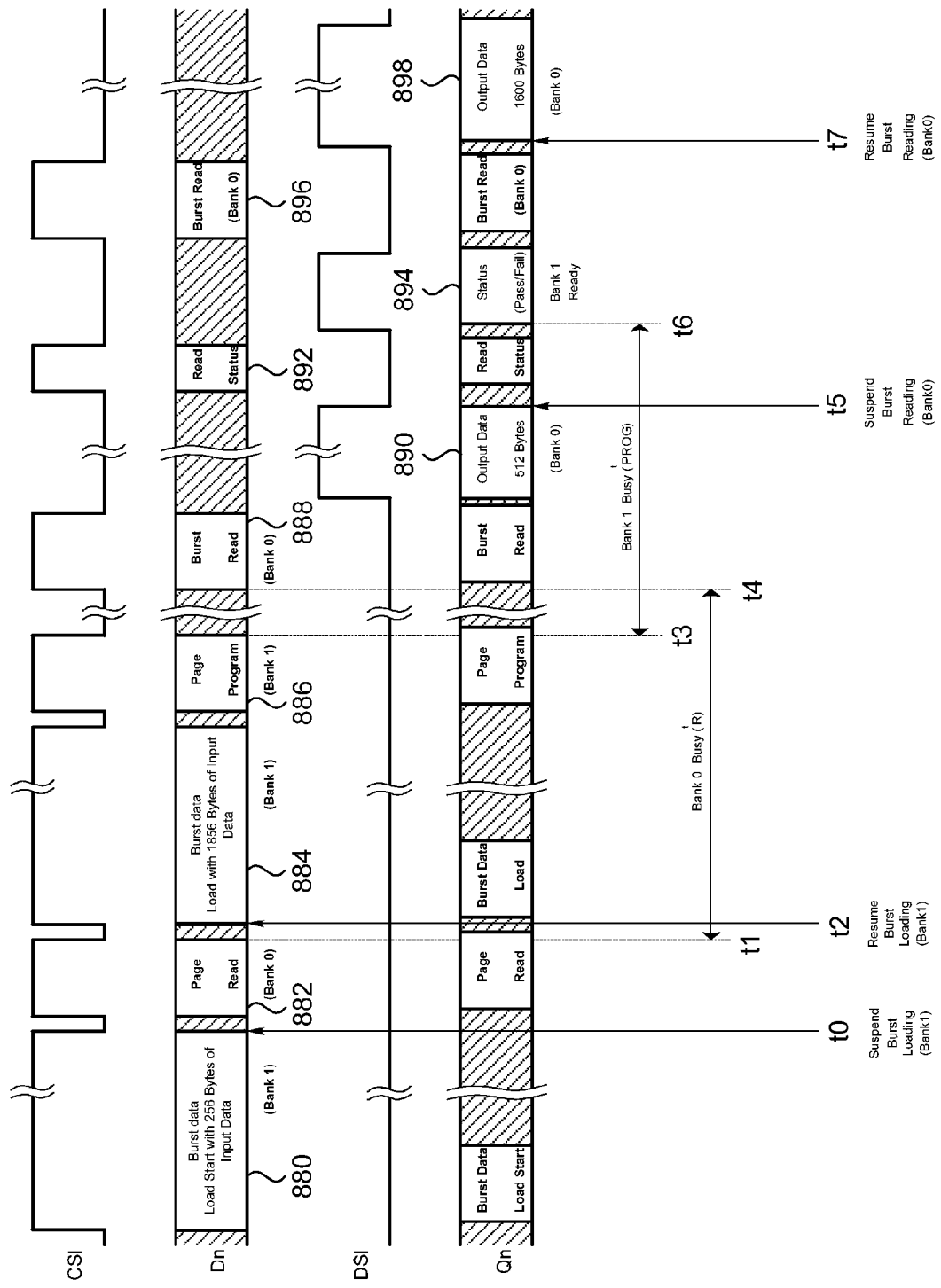
FIG. 15 is a sequence diagram illustrating a concurrent program and read operations for two different banks of a memory device, with suspended and resumed operation.

FIG. 15 is a sequence diagram illustrating a concurrent program and read operations for two different banks of the memory device, with suspended and resumed operation. A burst data load start command packet 880 for bank 1 is latched, and the data payload in the data field of the command packet is latched by the memory device. At time t0, the data loading into the memory device is suspended when the memory controller de-asserts CSI. In the present example, only 256 bytes of data have been latched by the memory device, which is tracked by the memory controller. A page read command packet 882 for bank 0 is latched, and core operations for bank 0 begin at time t1. The suspended data loading operation of command packet 880 is resumed at time t2 when a burst data load command packet 884 for bank 1 is received. The data payload in the data field of command packet 884 includes the remaining 1856 bytes of data that were not yet latched. Following is a page program command packet 886 for bank 1, and core operations for programming the data to bank 1 commences at time t3. Eventually, the core operations for bank 0 will be completed at time t4, and a burst read command packet 888 for bank 0 is issued by the memory controller and latched by the memory device. The read data is then output as a data read packet 890 when DSI is at the high logic level.

However, since a large amount of data is to be output, the host system may wish to confirm that programming to bank 1 is completed, since the controller will know that programming operations should be completed within a certain predetermined time, such as at time t6. Instead of waiting for all the read data to be output before sending the read status request, the outputting of the read data can be suspended at time t5 by deasserting DSI. Once the data output operation is suspended, a read status command packet 892 is issued by the memory controller and latched by the memory device. Then a corresponding read data packet 894 containing the status register value is provided. After DSI is deasserted at the end of the read data packet 894, the burst read can resume. This is done by having the memory controller issue a burst read command packet 896 for bank 0, which will include the address of the next bit to be output prior to the suspended read at time t5. At time t7, the remaining 1600 bytes are output from the Qn output port as read data packet 898.

The suspended operation example of FIG. 15 illustrates the advantages of the modular command structure for executing concurrent operations, each of which can be suspended and resumed in order to maximize core utilization and utilization of the channel.

The example sequences and operations of FIGS. 11 to 15 rely on the CSI and DSI strobe signals to provide information about the command packets or the read data packets. Because the command packets are variable in size, and there is no header information to indicate the bit length of the command packet, the CSI strobe signal functions as a header for the command packet that is provided in parallel with the serial command packet. The CSI signal is active for the length of the command packet, and is used by the memory device to latch the command packet data appearing on the Dn input port into the appropriate registers. The DSI signal is active for the length of the expected read data packet, which is known by the memory controller, and travels in parallel with the read data packet. Hence the active DSI signal functions as a header for the read data packets. Therefore, the lengths of the command packet and the read data packet corresponding to the lengths of their respective CSI and DSI strobe signals.

Since both read data packets and command packets travel along the same signal lines connected between the Dn and Qn ports of adjacent memory devices, the presence of a CSI strobe with data designates the data as a command data packet while the presence of a DSI strobe with data designates the data as read data. Therefore, the strobe signals further identify the type of data traveling through the memory system. The memory controller will track the DSI strobes it issues so that can match a received read data packet with the type of data that is expected. For example, the read data packet can include status register information or data read from a memory array.

In view of the functional relevance of the CSI and DSI signals, a minimum separation time is inserted between subsequent strobe signals of any type. This is for ensuring that every command packet and read data packet is distinct and defined, and to ensure that the proper type of data is latched by the memory device of the memory controller. There are four possible situations where the separation is used. These are CSI-to-CSI separation ($t_{CCS}$), CSI-to-DSI separation ($t_{CDS}$), DSI-to-CSI separation ($t_{DCS}$), and DSI-to-DSI separation ($t_{DDS}$).

The CSI-to-CSI separation, $t_{CCS}$, is the minimum separation time, in clock periods ($t_{CK}$), between consecutive command packets to the same or different device. This separation time allows for the previous command to be cleared from the memory device, by clearing the command register and resetting any command logic for example, in preparation for the new command. The DSI-to-DSI separation, $t_{DDS}$, is the minimum separation time, in clock periods ($t_{CK}$), between consecutive read data packets to the same device. This separation time allows the output buffer circuits to reset in preparation for the next data to be output. The DSI-to-CSI separation, $t_{DCS}$, is the minimum separation time, in clock periods ($t_{CK}$), between a read data packet and a subsequent command packet to the same or different device. The CSI-to-DSI separation, $t_{CDS}$, is the minimum separation time, in clock periods ($t_{CK}$), between a command packet and a read data packet to the same device. These two separation times ensures that the proper data type is latched by the memory device, since both may appear in succession on the Dn input port of a memory device. Since the memory controller issues the CSI and DSI signals with knowledge of the command packet or data packet bit lengths, it will ensure that the command packets and data packets themselves are separated by the same minimum time as the strobe signals.

Figure 16:
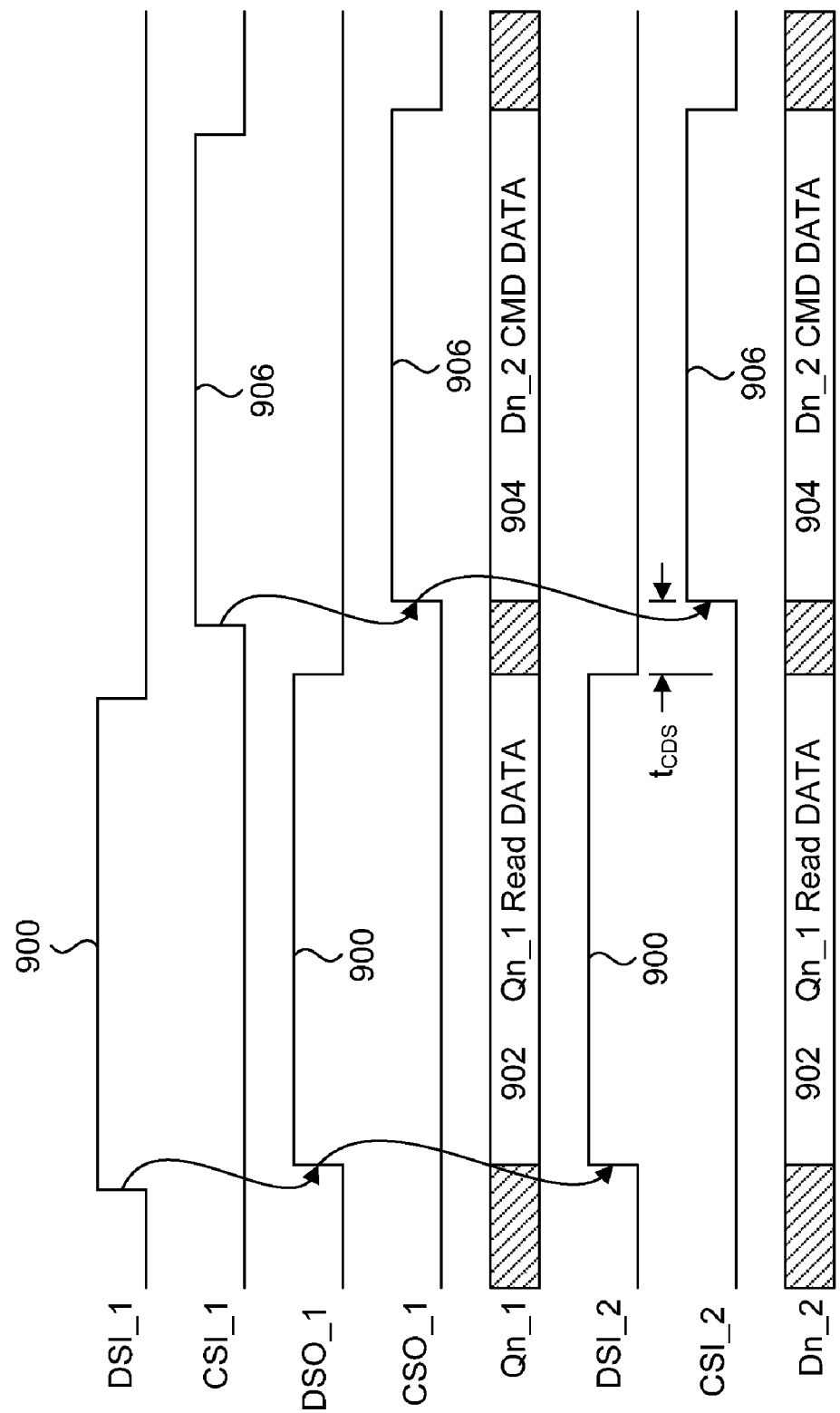
FIG. 16 is a sequence diagram illustrating the operation of two serially connected memory devices.

Examples of these separation times are annotated in FIGS. 11 to 14, and it is noted that the minimum separation time can be one data latching edge of the clock, which can be fractions of a clock period depending on the data rate architecture being employed. For example, in a single data rate architecture (SDR) where data is latched on the rising edge of the clock, the minimum separation time would be one clock cycle, or period. In a double data rate architecture (DDR) where data is latched on both the rising edge and the falling edge of the clock, the minimum separation time would be 0.5 of a clock period. FIGS. 11 to 15 are examples of concurrent operations in a single memory device, and do not clearly illustrate the relevance of the CSI-to-DSI separation or DSI-to-CSI separation. FIG. 16 is a sequence diagram illustrating the relevance of the CSI-to-DSI or DSI-to-CSI separation.

FIG. 16 is an example scenario where a first memory device outputs its read data from its Qn output port and a second serially connected memory device receives a command packet after the read data is output from the first memory device. The two memory devices referred to in this example can correspond to those shown in FIGS. 4 and 5, for example. Signal traces for the DSI_1, CSI_1, DSO_1, CSO_1 and Qn_1 ports are shown for the first memory device, where the appended "_1" designates ports of the first memory device. Signal traces for the DSI_2, CSI_2 and Dn_2 ports are shown for the second memory device, where the appended "_2" designates ports of the second memory device. It is assumed that the first memory device has previously received one or more command packets for reading out data therefrom. As a result, DSI_1 receives strobe signal 900 for outputting the data onto the Qn_1 port, as a read data packet 902. Read data packet 902 is labeled "Qn_1 Read DATA". Since the read data and the strobe signals are serially passed from the first memory device to the second memory device, DSO_1 passes the strobe signal 900 received from the DSI_L1 port to the DSI_2 port of the second memory device. Similarly, read data packet 902 is passed from the Qn_1 port of the first memory device to the DN_2 port of the second memory device.

The memory controller now issues a command packet 904 addressed to the second memory device, labeled "Dn_2 CMD DATA", with an accompanying CSI strobe signal 906. Strobe signal 906 is passed through the first memory device via CSI_1 and the command packet is passed through the Dn input port of the first memory device (not shown in FIG. 16) and out through the Qn_1 output port. The first memory device will ignore command packet 904 because it is addressed to the second memory device. The first memory device then passes strobe signal 906 to the CSI_2 port of the second memory device from its CSO_1 port, and passes command packet 904 to the Dn_2 input port of the second memory device from its Qn_1 output port. Because there is a minimum separation $t_{CDS}$ between the falling edge of strobe signal 900 and the rising edge of strobe signal 906, and a minimum separation between the last bit of read data packet 902 and the first bit of command packet 904, the second memory device will reliably latch command packet 904 in the appropriate registers. If on the other hand, command packet 904 and its corresponding strobe signal 906 were issued without any separation $t_{CDS}$, the second memory device could latch read data bits of read data packet 902 as part of command packet 904. Accordingly, the minimum separation ensures that there is no mixing of data types.

The memory devices in the previously described memory systems, especially non-volatile memory devices, have the advantage of being able to retain stored data when there is no power supplied to the memory device. However, the transition between full power operation and no power at all, or a power saving level, can jeopardize the integrity of the stored data.

Figure 17A:
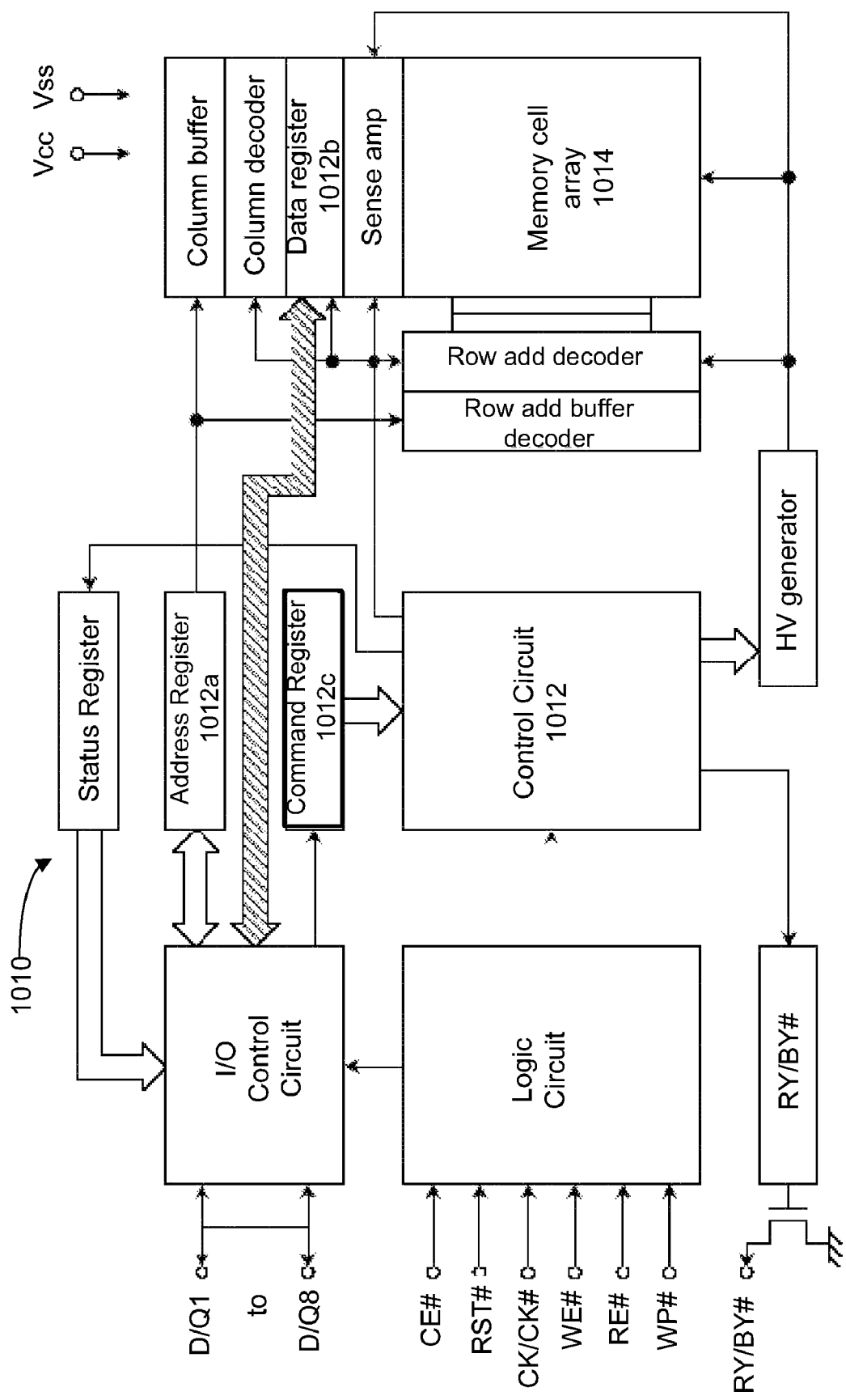
FIG. 17A is a block diagram of a flash memory device to which embodiments of the present invention are applicable.

FIG. 17A shows a flash memory device to which embodiments of the present invention are applicable. Referring to FIG. 17A, a flash memory 1010 includes logic circuitry such as control circuit 1012, for controlling various functions of the flash circuits, an address register 1012a for storing address information, a data register 1012b for storing program data information, a command register 1012c for storing command data information, high voltage circuits for generating the required program and erase voltages, and core memory circuits for accessing the memory array 1014. The control circuit 1012 includes a command decoder and logic for executing internal flash operations, such as read, program and erase functions. Those skilled in the art will understand that these operations are executed in response to the command data stored in the command register 1012c, sometimes in combination with the address data and program data stored in the respective address register 1012a and data register 1012b, depending on the operation to be executed. The command data, address data and program data are issued by a memory controller and latched into the corresponding registers by flash memory 1010. Basic functions of the shown circuit blocks of flash memory 1010 are known in the art. Persons skilled in the art will understand that flash memory 1010 shown in FIG. 17A represents one possible flash memory configuration amongst many possible configurations.

For a proper operation of the Flash memory 1010, the registers storing address, data and command information have to be reliable. An improper value stored in the register results in device malfunction. For example, varying supply voltages can cause the registers to randomly change states of the information stored in a command register 1012c, possibly resulting in a bit pattern corresponding to a received program or erase command. In such instances a spurious program operation will cause random data in the data register 1012b to be programmed to a random address in the address register 1012a of the memory array 1014. If data exists at this address, then the memory cells corresponding to that address will be subjected to programming voltages, and their threshold voltages may be changed. A spurious erase operation may result in erasure of existing data in the memory array 1014. Because the memory controller is not aware of the spurious operations executed by the flash memory 1010, the lost data is irretrievable.

Figure 17B:
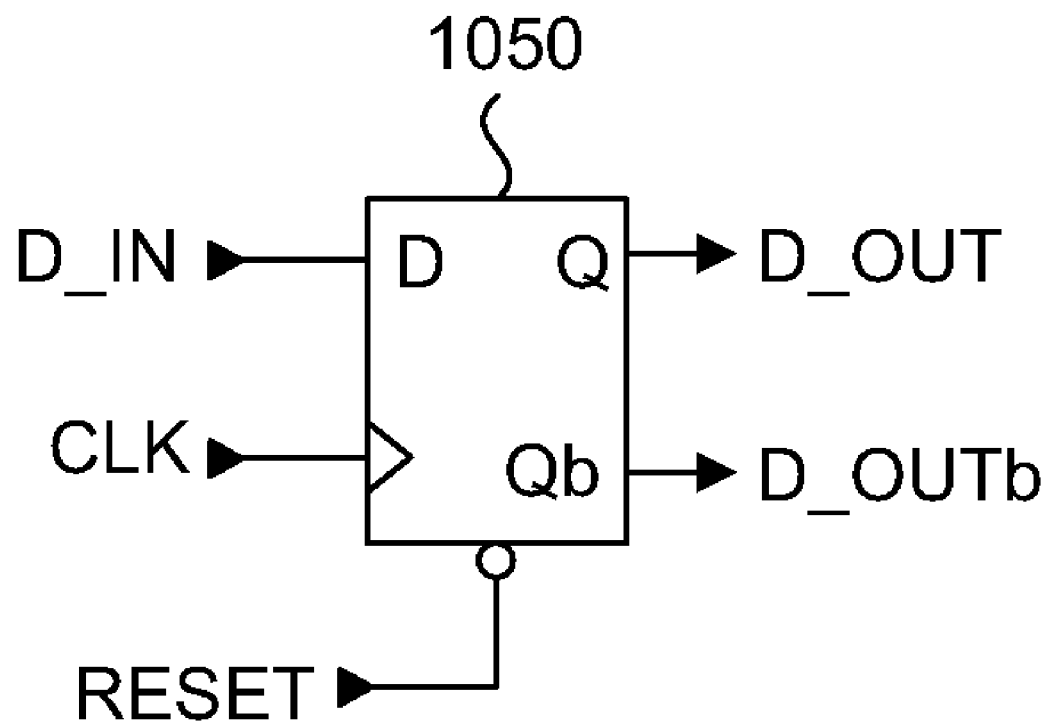
FIG. 17B is a schematic of a flip-flop.

The registers of the Flash memory 1010 are typically designed with flip-flop circuits having two stable states. A D flip-flop is a commonly known circuit in the art, as shown in FIG. 17B. D flip-flop 1050 has a D-input for receiving input data D_IN, which is latched internally on an active edge of a clock signal CLK, such as a rising edge of CLK. When latched, the Q-output will provide D_OUT, which corresponds to the logic state of D_IN, while the complementary Qb output will provide D_OUTb, which corresponds to the inverted logic state of D_IN. A reset input clears the latches while signal RESET is at an active logic level, such as $V_{SS}$ or ground, for example. Each flip-flop circuit thereby stores one bit of data, and the command register 1012c will include a plurality of flip-flop circuits. As should be known by persons skilled in the art, the flip-flop latch circuit can include a pair of cross-coupled inverting circuits.

Figure 18:
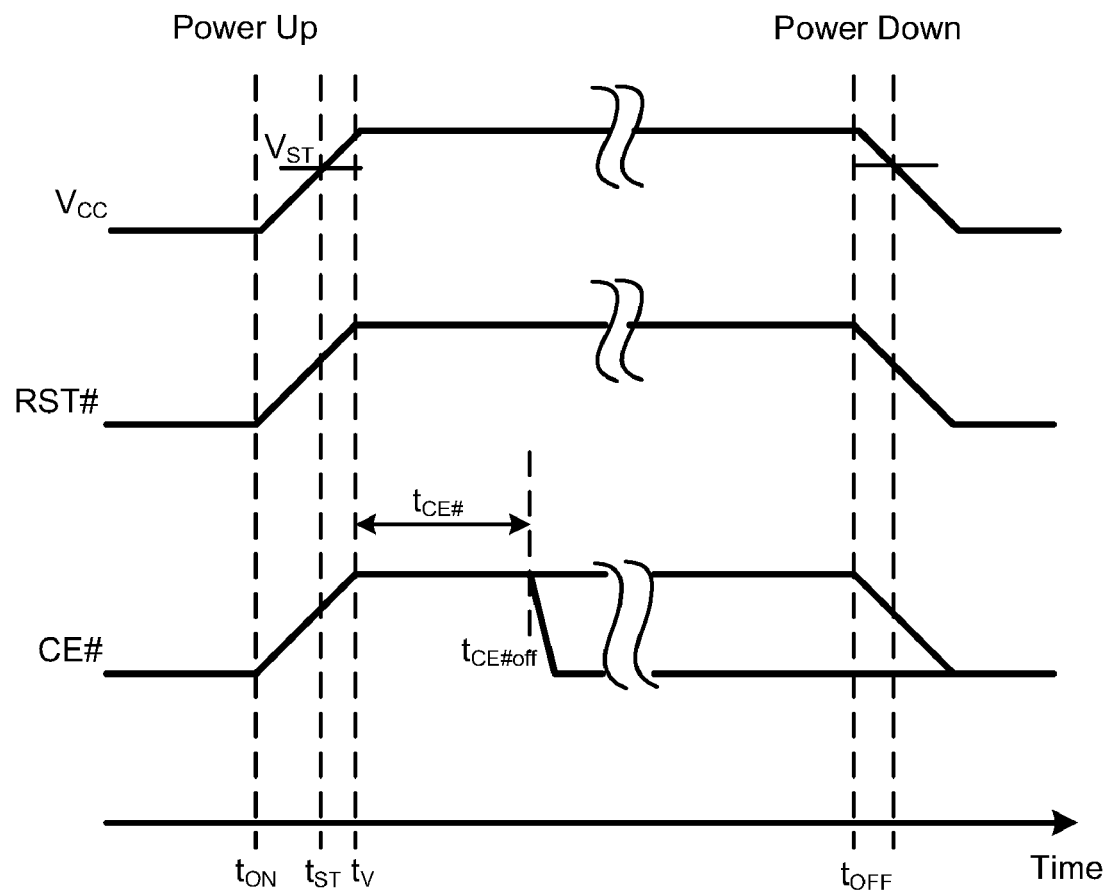
FIG. 18 is a sequence diagram of various control signals during power up and power down operations in the flash memory device of FIG. 17A.

FIG. 18 illustrates a sequence diagram of a voltage supply $V_{CC}$, an active low logic level reset signal RST#, and an active low logic level chip enable signal CE# during power up and power down operations in a typical Flash memory 1010. During a power up operation, the power supply voltage $V_{CC}$, begins its transition from the low GND or $V_{SS}$ voltage level to the high $V_{CC}$ voltage level at an on time $t_{ON}$. The $V_{CC}$ voltage level ramps up, and at time $t_{ST}$, reaches a stable voltage level $V_{ST}$, at which time the flash memory 1010 can be operated. Eventually the $V_{CC}$ voltage level reaches the maximum $V_{CC}$ level at time $t_P$. The device reset and enable signals, RST# and CE#, respectively, received from an associated memory controller, are driven to the inactive high logic level simultaneously at time $t_{ON}$, but follow the ramping voltage of $V_{CC}$. Once the RST# is de-asserted, or at the inactive logic level, the device is in a "ready" state and operable to receive commands from the memory controller. Optionally, the controller de-asserts the CE# signal at time $t_{ON}$ by driving it to the inactive high logic level while the device is in the reset state. Since $V_{CC}$ is ramping towards its maximum voltage level, CE# will follow the $V_{CC}$ ramp. The CE# signal can be asserted at time $t_{CEOff}$ to allow the device enter a normal run state. The time $t_{CEOff}$ occurs after at least a time interval of $t_{CE\#}$ has elapsed after the RST# signal has been de-asserted, or driven to the inactive high logic level (i.e., after time $t_P$). Once the device enters the normal run state, initialization operations can be performed both at the device level and at the system level. However, during the $V_{CC}$ transition time i.e., from time $t_{ON}$ to time $t_P$, or at least until time $t_{ST}$, the control signals to the registers cannot be precisely controlled. This can lead to spurious information being stored in the various registers of the Flash memory 1010, which can cause improper programming or erasure of data resulting in loss of data integrity in the Flash memory 1010.

The loss of data integrity due to involuntary program/erase operations during power transitions is exacerbated in present generation Flash devices where the ever-increasing need for speed, size reduction, as well as the desire to lower power consumption, require the Flash devices to routinely operate at lower $V_{CC}$ voltage levels. Lower operating $V_{CC}$ levels amplify the problems associated with spurious information being stored in the various registers of the flash device thereby adversely affecting data reliability.

A method for data protection during power transitions such as, power up and power down operations, in a non-volatile memory device is described. Prior to asserting any power transitions, a reset signal is asserted to disable functions of the memory device. The reset signal is maintained for a preset time during which the device voltage is expected to stabilize. During this time all internal registers, such as command registers of the device, are set to default values thereby preventing data loss due to spurious program/erase commands being executed by the device.

Figure 19:
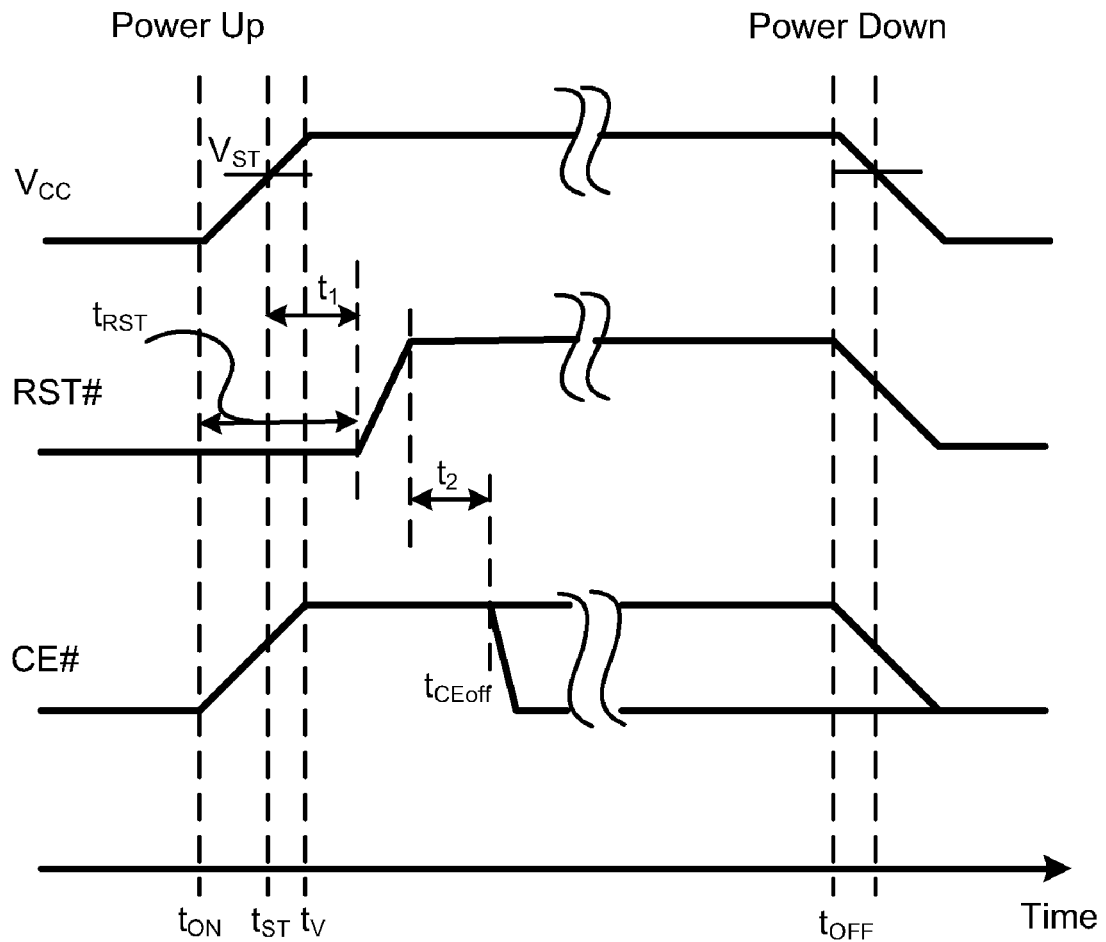
FIG. 19 is a sequence diagram of various control signals during power up and power down operations in a non-volatile memory device.

FIG. 19 is an illustration of a sequence diagram of a voltage supply $V_{CC}$, an active low logic level reset signal RST#, and an active low logic level chip enable signal CE# during power up and power down operations in a non-volatile memory device according to an embodiment of the present invention. As described earlier, the $V_{CC}$ voltage transitions from the low GND or $V_{SS}$ voltage level to the high $V_{CC}$ voltage level at time $t_{ON}$. Alternately, the $V_{CC}$ voltage level can transition from a low power mode level to the $V_{CC}$ voltage level. The $V_{CC}$ voltage level ramps up in time and at time $t_{ST}$, exceeds a stable voltage level $V_{ST}$, at which the flash memory 1010 can be operated. Eventually the $V_{CC}$ voltage level reaches the maximum $V_{CC}$ level at time $t_V$. However, in order to prevent device malfunction due to spurious information being latched into the command registers, a controller such as a memory controller associated with the non-volatile memory device holds the RST# signal at the active low logic level to disable all functions of the device for a wait time period, which is at least the time taken for the $V_{CC}$ voltage level to reach the stable $V_{ST}$ voltage level (time from $t_{ON}$ to $t_{ST}$). In the embodiment shown in FIG. 19, the RST# signal is held at the active low logic level for an extended time period $t_{RST}$, i.e., from $t_{ON}$ to $t_{ST}$ plus at least a time interval $t_1$ after the $V_{CC}$ level reaches a stable voltage level $V_{ST}$. All internal registers of the device will therefore be held in a default or reset state while the RST# signal is at the active low logic level.

Eventually, the controller will de-assert RST# after a time interval $t_{RST}$ as shown in FIG. 19. After this time, the power will be stabilized and the device components can then prepare or initialize themselves for operation. Optionally, the controller de-asserts the CE# signal at time $t_{ON}$ by driving it to the inactive high logic level while the device is in the reset state. Since $V_{CC}$ is ramping towards its maximum voltage level, CE# will follow the $V_{CC}$ ramp. The CE# signal can be asserted at time $t_{CEOff}$ to allow the device enter a normal run state. The time $t_{CEOff}$ occurs after at least a time interval of $t_2$ has elapsed after the RST# signal has been de-asserted, or driven to the inactive high logic level. Once the device enters the normal run state, initialization operations can be performed both at the device level and at the system level. Deliberately holding the device in a reset state for a predetermined amount of time during the power transition operation prevents spurious information from being stored in or latched onto the various registers of the device. The device is thus safeguarded against improper and inadvertent programming or erasure of data, ensuring data integrity during power transitions.

A similar procedure to ensure data protection can be followed during power down operations by asserting RST#, or by driving RST# to active low logic level, at a predetermined time prior to $t_{OFF}$, when $V_{CC}$ is turned off and driven to the low GND or $V_{SS}$ voltage level.

Figure 20:
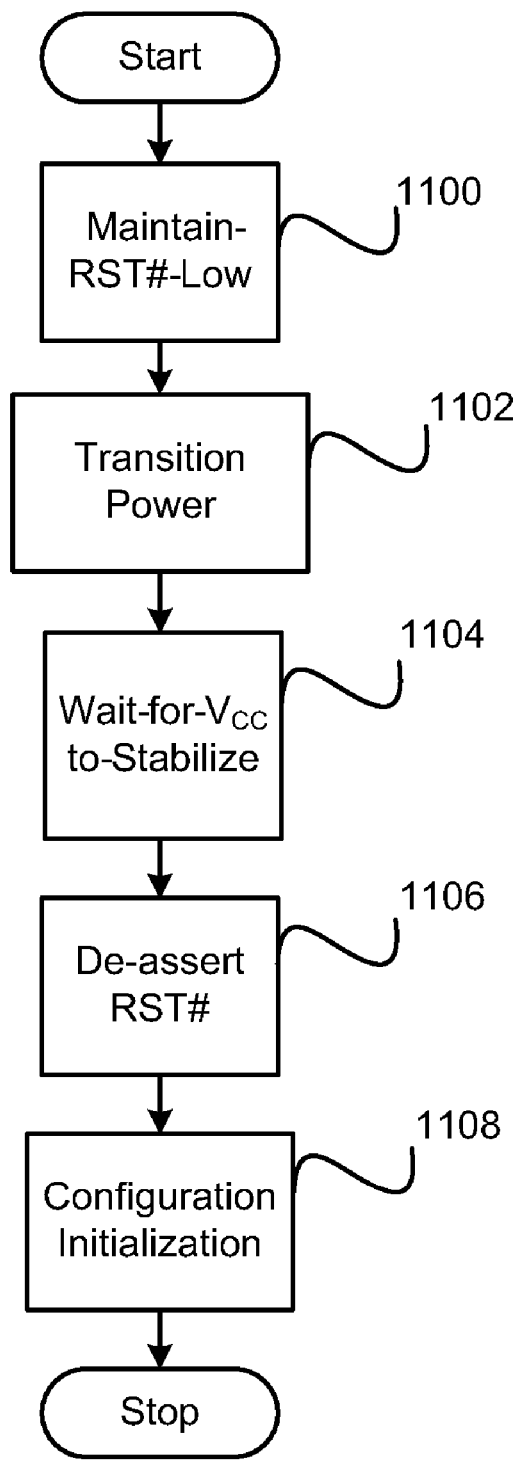
FIG. 20 is a flow chart illustrating a method for data protection during power transitions in a non-volatile memory device; and, FIG. 21 is a flow chart illustrating a method for data protection during power transitions in a non-volatile memory device according to another embodiment of the present invention.

A flow chart illustrating a method for data protection during power transitions in a non-volatile memory device according to an embodiment of the present invention is shown in FIG. 20. A memory controller controlling the non-volatile memory device, such as a Flash memory device, maintains the RST# low prior to any power transitions (step 1100) to place the device in a reset state. During this time, the internal registers of the device are set to a default or reset state. The controller then allows the power to transition (step 1102) and waits for a predetermined time period for the internal voltage of the device to stabilize (step 1104). The wait time period corresponds to $t_{RST}$ shown in FIG. 19 and is at least the time taken for the $V_{CC}$ voltage level to reach the stable $V_{ST}$ voltage level (time from $t_{ON}$ to $t_{ST}$) plus at least a time interval $t_1$ after the $V_{CC}$ level reaches a stable voltage level $V_{ST}$. The time interval $t_1$ can be determined based on the device characteristics such as operating voltage and process technology. For example, the total time period for which the RST# is held low, i.e., $t_{RST}$, can be 10 µs or greater. During this time period various components of the device stabilize and the clocks become operational and become frequency and phase stable.

After the elapse of time period $t_{RST}$, the controller asserts a RST# high signal when the device is expected to be in a "ready" state (step 1106). As described with respect to FIG. 19, the controller asserts the CE# signal at time $t_{ON}$ while the device is in the reset state and brings it to a disabled state after RST# is de-asserted to release the memory device from the reset state. The CE# signal is de-asserted at time $t_{CEOff}$ to allow the device enter a normal run state. The time $t_{CEOff}$ is after at least a time interval of $t_2$ has elapsed after the RST# signal has been asserted. Once the device enters the normal run state, initialization operations can be performed both at the device level and at the system level (step 1108). Similar to time interval $t_1$, the time interval $t_2$ can be determined based on the device characteristics and will vary from one memory system to another. For example, $t_2$ can be 100 µs or greater.

Figure 21:
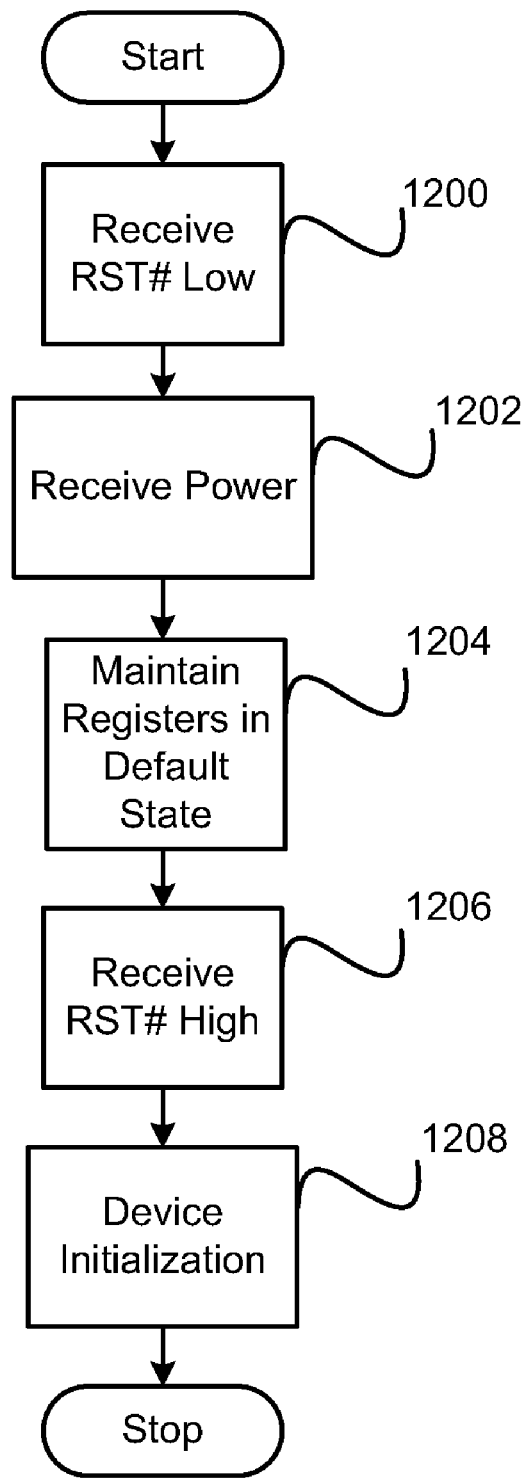

FIG. 21 describes the steps involved at the device during power transitions in order to ensure data protection in accordance with an embodiment of the present invention. The non-volatile memory device receives, from a memory controller controlling the device, a RST# low signal prior to any power transitions (step 1200). The device then receives power from the controller to activate device components (step 1202). This received power can be an increase from a VSS voltage or from a low power mode voltage level to the full VCC operating voltage level. Due to the RST# signal being low, the device is placed in a reset state. During this time, the internal registers of the device and any finite state machines are set to and maintained at a default or reset state (step 1204). The controller then waits for a predetermined time period for the internal voltage of the device to stabilize prior to asserting RST# high. After the elapse of time period $t_{RST}$, the controller asserts a RST# high signal when the device is expected to be in a "ready" state. The device receives the RST# high signal and places the device in a "ready" state (step 1206). The controller asserts the CE# signal at time $t_{CEOff}$ to allow the device enter a normal run state. As described earlier, once the device enters the normal run state, initialization operations can be performed at the device level (step 1208).

Following is a discussion of the method for data protection during power transitions in the memory system 200 of FIG. 4. On power-up, the memory controller 202 will hold Reset (RST#) low to keep all the memory devices 204, 206, 208, and 210 in reset while power stabilizes and the devices prepare themselves for operation. RST# will be held low by the controller 202 for a minimum of $t_1$ (for example, 20 µs) after $V_{CC}$ stabilizes, as shown in FIG. 19. While RST# is being held low, all finite state machines in the memories are initialized, and any configuration and status registers are reset to their default or reset state. Prior to RST# being de-asserted to a high logic level, the clocks become operational and become frequency and phase stable. As described with respect to FIG. 19, the controller 202 de-asserts the CE# signal at time $t_{ON}$ while the device is in the reset state and asserts CE# after RST# has been de-asserted. The CE# signal is asserted at time $t_{CEOff}$ to allow the device enter a normal run state. The time $t_{CEOff}$ is after at least a time interval of $t_2$ has elapsed after the RST# signal has been asserted. Once the device enters the normal run state, initialization operations can be performed both at the device level and at the system level. Examples of initialization operations include device address and identifier generation and assignment for each of the devices in the serial connection. Various methods for device address and identifier generation described in co-pending U.S. patent application Ser. Nos. 11/622,828; 11/750,649; 11/692,452; 11/692,446; 11/692,326; and, 11/771,023, the teachings of which are incorporated herein by reference in their entirety.

By ensuring that the device is in a reset state for a predetermined amount of time during the power transition operation prevents spurious information from being stored in or latched onto the various registers of the device. The device is thus safeguarded against improper programming or erasure of data, ensuring data integrity during power transitions.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

Embodiments of the invention can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention can also be stored on the machine-readable medium. Software running from the machine-readable medium can interface with circuitry to perform the described tasks.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A memory system comprising:
   a controller having a serial channel output port for providing a serial bitstream command packet, a control output port for providing a data output control signal, and a serial channel input port for receiving a serial bitstream read data packet, the serial bitstream command packet including an operational code and a device address;
   a memory device having an input port for receiving the serial bitstream command packet from the controller and for executing the operation code if the device address corresponds to the memory device, and a control input port for receiving the data output control signal, the memory device providing the serial bitstream command packet through an output port and subsequently providing the serial bitstream read data packet through the output port in response to the data output control signal if the operation code corresponds to a read function; and
   an expansion link between the controller and the memory device, to which one of a memory expansion module and a jumper is insertable.

2. The memory system of claim 1, further including at least one intervening memory device coupled in series between the memory device and the controller, the at least one intervening memory device having an input port for receiving and passing the serial bitstream command packet to the memory device, and subsequently providing the serial bitstream read data packet if the device address corresponds to the memory device and the operation code corresponds to a read function.

3. The memory system of claim 2, wherein complementary clock signals are provided to the memory device and the at least one intervening memory device in parallel.

4. The memory system of claim 2, wherein complementary clock signals are provided to the at least one intervening memory device, and passed by the at least one intervening memory device to the memory device, and passed by the memory device to the controller.

5. The memory system of claim 2, wherein the at least one intervening memory device is part of the memory expansion module having coupling means configured for electrical coupling with the expansion link.

6. The memory system of claim 2, wherein the memory device and the at least one intervening memory device each include a native memory core and a serial interface and control logic block for controlling the native memory core in response to the serial bitstream command packet.

7. The memory system of claim 6, wherein the memory device native memory core and the at least one intervening memory device native memory core are NAND flash based.

8. The memory system of claim 6, wherein the memory device native memory core and the at least one intervening memory device native memory core are different.

9. The memory system of claim 2, wherein the native memory core includes one of DRAM, SRAM, NAND flash and NOR flash memory cores.

10. The memory system of claim 1, wherein the serial bitstream command packet has a modular structure where the size of the serial bitstream command packet is variable.

11. The memory system of claim 10, wherein the serial bitstream command packet includes a command field for providing the operation code and the device address.

12. The memory system of claim 11, wherein the command field includes a first sub-field for providing the operation code, and a second sub-field for providing the device address.

13. The memory system of claim 10, wherein the serial bitstream command packet includes a command field for providing the operation code and the device address, and an address field for providing one of a row address and a column address.

14. The memory system of claim 10, wherein the serial bitstream command packet includes a command field for providing the operation code and the device address, an address field for providing one of a row address and a column address, and a data field for providing write data.

15. The memory system of claim 10, wherein the controller provides a command strobe in parallel with the serial bitstream command packet, the command strobe having an active level matching the length of the serial bitstream command packet.

16. The memory system of claim 15, wherein the controller provides a data input strobe in parallel with the serial bitstream read data packet, the data input strobe having an active level matching the length of the serial bitstream read data packet.

17. The memory system of claim 16, wherein the memory device latches the serial bitstream command packet in response to the active level of the command strobe when the device address corresponds to the memory device.

18. The memory system of claim 17, wherein the memory device input port is enabled in response to the active level of the data input strobe.

19. The memory system of claim 18, wherein the command strobe and the data input strobe are non-overlapping signals.

20. The memory system of claim 18, wherein the command strobe and the data input strobe are separated by at least one data latching clock edge.

21. The memory system of claim 18, wherein the command strobe is separated from an adjacent command strobe by at least one data latching clock edge.

22. The memory system of claim 18, wherein the data input strobe is separated from an adjacent data input strobe by at least one data latching clock edge.

23. The memory system of claim 1, wherein the memory expansion module receives the serial bitstream command packet and passes the serial bitstream command packet to one of the memory device or the controller.

24. The memory system of claim 23, wherein the memory expansion module includes at least one intervening memory device for receiving the serial bitstream command packet and outputting the serial bitstream command packet.

25. The memory system of claim 1, wherein the jumper and the memory expansion module are releasably retained in the at least one expansion link.

26. The memory system of claim 25, wherein the jumper is inserted into the at least one expansion link in a first configuration of the memory system, and the memory expansion module is inserted into the at least one expansion link in a second configuration of the memory system having a memory capacity greater than the first configuration.

27. The memory system of claim 25, wherein the at least one expansion link includes a first terminal for receiving the serial bitstream command packet and a second terminal for providing the serial bitstream command packet, the jumper being configured for electrically coupling the first terminal to the second terminal when inserted into the at least one expansion link.

28. The memory system of claim 1, wherein the at least one expansion link includes at least two expansion links serially connected between the controller and the memory device.

29. A memory system comprising:
a plurality of memory devices;
a controller for controlling the devices,
wherein the controller has an output port for providing a bitstream command packet to a first device of the plurality of memory devices and a control output port for providing a data output control signal, the bitstream command packet including an operational code and a device address,
each of the plurality of memory devices receiving the bitstream command packet and the data output control signal from one of the controller and a prior memory device and executing the operation code if the device address corresponds thereto, each of the plurality of memory devices providing the bitstream command packet to one of a next memory device and the controller, a bitstream read data packet being provided from a last memory device of the plurality of memory devices to the controller in response to the data output control signal if the operation code corresponds to a read function; and
at least one expansion link coupled between
the controller and a memory device of the plurality of memory devices, or
between two adjacent memory devices of the plurality of memory devices, the expansion link configured for insertion of one of a memory expansion module and a jumper.

30. The memory system of claim 29, wherein the plurality of memory devices is connected in series, the first and last memory devices being connected to the controller.

31. The memory system of claim 29, wherein the controller sends a bitstream data packet to the first device of the plurality of memory devices.

32. The memory system of claim 31, wherein the bitstream data packet from the controller and the bitstream read data packet comprises a serial bitstream.

33. The memory system of claim 31, wherein the bitstream data packet from the controller and the bitstream read data packet comprises parallel bitstreams.

34. The memory system of claim 29, wherein the plurality of memory devices are of the same type or a mix of different types of memory devices.

35. The memory system of claim 29, wherein the memory expansion module receives the bitstream command packet and passes the bitstream command packet to one of the plurality of memory devices or the controller.

36. The memory system of claim 35, wherein the memory expansion module includes at least one intervening memory device for receiving the bitstream command packet and outputting the bitstream command packet.

37. The memory system of claim 29, wherein the jumper and the memory expansion module are releasably retained in the at least one expansion link.

38. The memory system of claim 37, wherein the jumper is inserted into the at least one expansion link in a first configuration of the memory system, and the memory expansion module is inserted into the at least one expansion link in a second configuration of the memory system having a memory capacity greater than the first configuration.

39. The memory system of claim 37, wherein the at least one expansion link includes a first terminal for receiving the bitstream command packet and a second terminal for providing the bitstream command packet, the jumper being configured for electrically coupling the first terminal to the second terminal when inserted into the at least one expansion link.

40. The memory system of claim 29, wherein the at least one expansion link includes
at least two expansion links serially connected between the controller and the memory device, or
between the two adjacent memory devices.

* * * * *

UNITED STATES PATENT AND TRADEMARK OFFICE
CERTIFICATE OF CORRECTION

| | | |
|---|---|---|
| PATENT NO. | : 8,407,395 B2 | Page 1 of 1 |
| APPLICATION NO. | : 11/843440 | |
| DATED | : March 26, 2013 | |
| INVENTOR(S) | : Kim et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 665 days.

Signed and Sealed this
Second Day of December, 2014

Michelle K. Lee
*Deputy Director of the United States Patent and Trademark Office*